United States Patent
Matsuyama

(10) Patent No.: US 7,102,728 B2
(45) Date of Patent: Sep. 5, 2006

(54) IMAGING OPTICAL SYSTEM EVALUATION METHOD, IMAGING OPTICAL SYSTEM ADJUSTMENT METHOD, EXPOSURE APPARATUS AND EXPOSURE METHOD

(75) Inventor: Tomoyuki Matsuyama, Saitama (JP)

(73) Assignee: Nikon Corporation, Tokyo (JP)

( * ) Notice: Subject to any disclaimer, the term of this patent is extended or adjusted under 35 U.S.C. 154(b) by 72 days.

(21) Appl. No.: 10/372,779

(22) Filed: Feb. 26, 2003

(65) Prior Publication Data
US 2003/0206289 A1    Nov. 6, 2003

(30) Foreign Application Priority Data
Feb. 27, 2002    (JP) .............................. 2002-052180

(51) Int. Cl.
*G03B 27/42*    (2006.01)
(52) U.S. Cl. .......................................... 355/53; 355/77
(58) Field of Classification Search ..................... None
See application file for complete search history.

(56) References Cited

U.S. PATENT DOCUMENTS

| | | | |
|---|---|---|---|
| 4,309,602 | A | 1/1982 | Gonsalves et al. |
| 5,828,455 | A | 10/1998 | Smith et al. |
| 5,898,501 | A | 4/1999 | Suzuki et al. |
| 5,978,085 | A | 11/1999 | Smith et al. |
| 6,248,486 | B1 | 6/2001 | Dirksen et al. |
| 6,360,012 | B1 | 3/2002 | Kreuzer |
| 6,368,763 | B1 * | 4/2002 | Dirksen et al. ............... 430/30 |
| 2002/0008869 | A1 | 1/2002 | Van der Laan et al. |
| 2002/0036758 | A1 | 3/2002 | De Mol et al. |
| 2002/0145717 | A1 | 10/2002 | Baselmans et al. |
| 2002/0167651 | A1 | 11/2002 | Boonman et al. |
| 2003/0091913 | A1 * | 5/2003 | Shiode ........................ 430/22 |

FOREIGN PATENT DOCUMENTS

| | | |
|---|---|---|
| EP | 1 063 570 A2 | 12/2000 |
| EP | 1 079 223 A1 | 2/2001 |
| EP | 1 128 217 A2 | 8/2001 |
| EP | 1 164 436 A2 | 12/2001 |
| EP | 1 231 513 A1 | 8/2002 |
| EP | 1 231 514 A1 | 8/2002 |
| EP | 1 251 402 A1 | 10/2002 |
| JP | A 10-038757 | 2/1998 |
| JP | A 10-038758 | 2/1998 |
| JP | A 10-170399 | 6/1998 |

(Continued)

OTHER PUBLICATIONS

Freitag et al., "Aberration analysis in aerial images formed by lithographic lenses", Applied Optics, vol. 31, No. 13, pp. 2284-2290, 1992.

(Continued)

*Primary Examiner*—D. Rutledge
(74) *Attorney, Agent, or Firm*—Oliff & Berridge, PLC

(57) ABSTRACT

The evaluation method comprises a step (S11) of setting an aberration polynomial that generally expresses the aberration of the imaging optical system as a function of the image plane coordinates and pupil coordinates, a measurement step (S12) of measuring the wavefront aberration of the imaging optical system for a plurality of points in the image plane of the imaging optical system, an approximation step (S13) of approximating a specified polynomial as a function of the pupil coordinates to the wavefront aberration obtained in the measurement step, and a step (S14) of determining the coefficients of the respective terms of the aberration-polynomial on the basis of the coefficients of the respective terms in the specified polynomial obtained in the approximation step.

37 Claims, 7 Drawing Sheets

FOREIGN PATENT DOCUMENTS

| | | |
|---|---|---|
| JP | A 10-284368 | 10/1998 |
| JP | A 2000-097617 | 4/2000 |
| JP | A 2000-121491 | 4/2000 |
| JP | A 2000-146757 | 5/2000 |
| JP | A 2002-022609 | 1/2002 |
| JP | A 2002-071514 | 3/2002 |
| JP | A 2002-258131 | 9/2002 |
| WO | WO 00/55890 | 9/2000 |

OTHER PUBLICATIONS

Freitag et al., "Wavefront analysis of photolithographic lenses", JR VIII, pp. 1-5, 1991.

Pure Appl. Opt. 2 (1993) "Double Zernike expansion of the optical aberration function", Ivo W. Kwee et al., pp. 21-32.

Agurok, "Aberrations of perturbed and unobscured optical systems," SPIE, vol. 3779, Jul. 1999, pp. 166-177.

Agurok, "The optimum position and minimum number of field-of-view points for optical system wavefront comprehension," SPIE, vol. 4092, 2000, pp. 38-47.

* cited by examiner

IMAGING OPTICAL SYSTEM EVALUATION METHOD, IMAGING OPTICAL SYSTEM ADJUSTMENT METHOD, EXPOSURE APPARATUS AND EXPOSURE METHOD

BACKGROUND OF THE INVENTION

1. Field of the Invention

The present invention relates to an imaging optical system evaluation method, an imaging optical system adjustment method, an exposure apparatus and an exposure method, and more particularly relates to the aberration evaluation of an imaging optical system installed in an exposure apparatus.

2. Related Background Art

For example, exposure apparatuses which have built-in projection optical systems for transferring mask patterns onto the resists of wafers are used in lithographic processes that form circuit patterns in the manufacture of LSI. In current lithography, with the increase in the degree of integration of LSI and the compression of the k1 factor (line width=k1×λ/NA; λ indicates the wavelength, and NA indicates the numerical aperture of the projection optical system), there has been a demand for the reduction of the aberration of the projection optical system to the ultimate limit.

Accordingly, in recent years, wavefront aberration has been measured and analyzed using various types of wavefront aberration measuring devices. In the analysis process of wavefront aberration, the measured wavefront aberration is, usually approximated (fitted) using a fringe Zernike polynomial as a function of the pupil coordinates. Here, the Zernike polynomial is a function that expresses the distribution of the wavefront aberration within the pupil.

SUMMARY OF THE INVENTION

As was described above, the Zernike polynomial is a function that is suitable to express the wavefront aberration IC within the pupil in this case, however, it is necessary to perform optical adjustments with the optical adjustment method and optical adjustment amount determined by trial and error by means of optimizing calculations using a computer on the basis of the coefficients of the respective terms of the Zernike polynomial.

Meanwhile, functions introduced on the basis of aberration theory presupposing a rotational symmetry optical system, and functions introduced on the basis of the aberration theory of an optical system that includes eccentric error up to the cubic (light ray aberration) are known as functions that express the distribution of wavefront aberration within the image plane. However, conventional functions that express the distribution of wavefront aberration within the image plane are inadequate to express the conditions of aberration before and during the optical adjustment of a projection optical system which has an extremely large numerical aperture and field.

The present invention was devised in light of the abovementioned problems. It is an object of the present invention to provide an evaluation method which allow the analytical evaluation of the aberration of an imaging optical system by simultaneously expressing the distribution of the aberration of the imaging optical system within the pupil and the distribution of the aberration of the imaging optical system within the image plane. Furthermore, it is an object of the present invention to provide an adjustment method which makes it possible to achieve a favorable optical adjustment of the imaging optical system on the basis of an analytical evaluation of the aberration obtained by the evaluation method of the present invention. Moreover, it is an object of the present invention to provide an exposure apparatus and exposure method which make it possible to perform a favorable projection exposure using an imaging optical system that has been optically adjusted in a favorable manner by the adjustment method of the present invention.

In order to solve the abovementioned problems, the first invention of the present application is a method for evaluating the aberration of an imaging optical system comprising a step in which an aberration polynomial that generally expresses the aberration of the abovementioned imaging optical system as a function of image plane. coordinates and pupil coordinates is set, a measurement step in which the wavefront aberration of the abovementioned imaging optical system is measured for a plurality of points in the image plane of the abovementioned imaging optical system, an approximation step in which a specified polynomial as a function of the pupil coordinates is approximated to the abovementioned wavefront aberration obtained in the abovementioned measurement step, and a step in which the coefficients of the respective terms of the abovementioned aberration polynomial are determined on the basis of the coefficients of the respective terms of the abovementioned specified polynomial obtained in the abovementioned approximation step.

In a preferred aspect of the first invention, the abovementioned specified polynomial includes a Zernike polynomial. Furthermore, it is desirable that the abovementioned aberration polynomial be set so as to include at least one aberration component selected from among a rotational symmetric aberration component relating to the optical axis of the abovementioned imaging optical system, a decentering aberration component and an astigmatic (toric) aberration component. Furthermore, in another preferred aspect of the first invention, it is desirable that the abovementioned aberration polynomial be set so as to include at least one aberration component selected from among the antibody decentering aberration component and the abovementioned astigmatic aberration component.

Furthermore, in a desirable aspect of the first invention, the abovementioned rotational symmetric aberration component is expressed as a power series of invariable quantities with respect to the rotation in the abovementioned image place coordinates and the abovementioned pupil coordinates. In this case, it is desirable that the abovementioned decentering aberration component be expressed as the product of a linear dependent component of the coordinates in the abovementioned image plane coordinates and the abovementioned pupil coordinates, and a power series of invariable quantities with respect to the abovementioned rotation. Furthermore, it is desirable that the abovementioned astigmatic aberration component include the product of a quadratic dependent component of the coordinates in the abovementioned image plane coordinates and the abovementioned pupil coordinates, which is a 180-degree periodic function with respect to the rotation of the coordinates, and a power series of invariable quantities with respect to the abovementioned rotation. Furthermore, in a preferred aspect of the first invention, it is desirable that the abovementioned determining step include a second approximation step in which a second specified polynomial as a function of the abovementioned image plane coordinates is approximated to the image plane distribution of the coefficients of the respective terms in the abovementioned specified polynomial that is obtained in the abovementioned approximation step.

The second invention of the present application provides an adjustment method in which the abovementioned imaging optical system is optically adjusted on the basis of aberration information for this imaging optical system that is obtained by the evaluation method of the first invention.

The third invention of the present application provides an exposure apparatus which comprises an imaging optical system that is optically adjusted by the adjustment method of the second invention as a projection optical system that is used to project and expose the pattern of a mask onto a photosensitive substrate.

The fourth invention of the present application provides an exposure method in which an image of a pattern formed on a mask is projected and exposed onto a photosensitive substrate using an imaging optical system that is optically adjusted by the adjustment method of the second invention. The fifth invention of the present application provides an imaging optical system which is optically adjusted by the adjustment method of the second invention.

The sixth invention of the present application provides a method for evaluating the aberration of an imaging optical system on the basis of the wavefront aberration measured for a plurality of points in the image plane of the abovementioned imaging optical system, comprising a step in which an aberration polynomial that generally expresses the aberration of the abovementioned imaging optical system as a function of the image plane coordinates and pupil coordinates is set, an approximation step in which a specified polynomial as a function of the pupil coordinates is approximated to the abovementioned measured wavefront aberration, and a step in which the coefficients of the respective terms of the abovementioned aberration polynomial are determined on the basis of the coefficients of the respective terms in the abovementioned specified polynomial obtained in the abovementioned approximation step.

In a preferred aspect of the sixth invention of the present application, the abovementioned aberration polynomial is set so as to include at least one aberration component selected from among the abovementioned decentering aberration component and the abovementioned astigmatic aberration component. Furthermore, in another preferred aspect of the sixth invention of the present application, the abovementioned determining step includes a second approximation step in which a second specified polynomial as a function of the abovementioned image plane coordinates is approximated to the image plane distribution of the coefficients of the respective terms in the abovementioned specified polynomial obtained in the abovementioned approximation step.

The seventh invention of the present application provides a recording medium on which a program that executes the evaluation method of the sixth invention is recorded. The eighth invention of the present application provides a computer-receivable carrier wave which carries a signal including a program that executes the evaluation method of the sixth invention.

DESCRIPTION OF THE PREFERRED EMBODIMENTS

Embodiments of the present invention will be described with reference to the attached figures.

Figure 1:
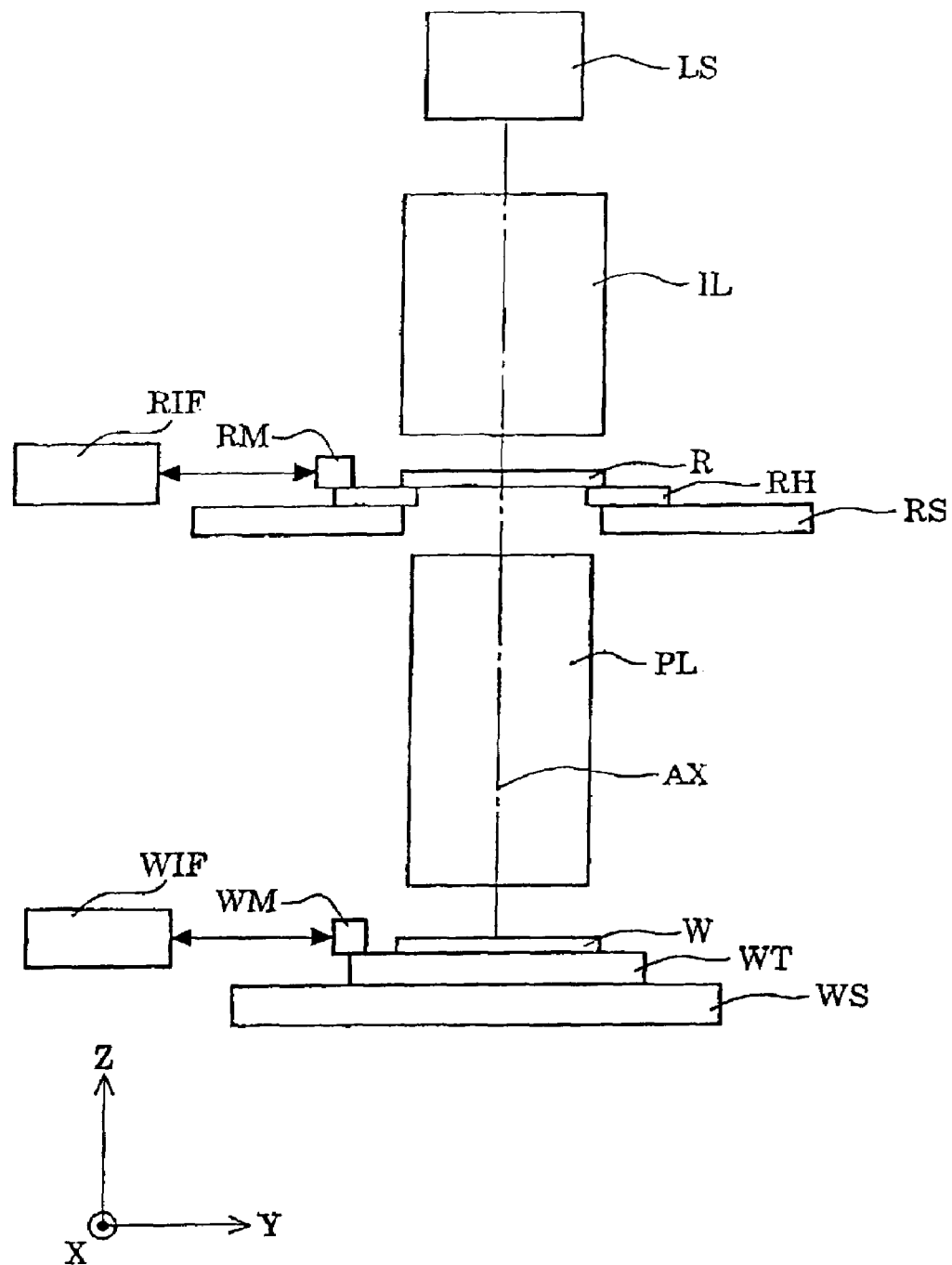
FIG. 1 is a schematic diagram of the construction of an exposure apparatus equipped with a projection optical system using an imaging optical system evaluation method that constitutes an embodiment of the present invention.

FIG. 1 is a schematic diagram of the construction of an exposure apparatus equipped with a projection optical system using an imaging optical system evaluation method constituting an embodiment of the present invention. In FIG. 1, the Z axis is set parallel to the optical axis AX of the projection optical system PL, the Y axis is set parallel to the plane of the page in FIG. 1 within the plane perpendicular to the optical axis AX, and the X axis is set perpendicular to the plane of the plate in FIG. 1 within the plane perpendicular to the optical axis AX.

The exposure apparatus shown in FIG. 1 is equipped with (for example) an $F_2$ laser light source (wavelength 157 nm) as a light-source LS that is used to supply illuminating light. The light emitted from the light source LS illuminates a reticle (mask) R on which a specified pattern is formed via an illumination optical system IL. Furthermore, the light path between the light source LS and the illumination optical system IL is sealed by a casing (not shown in the figures), and the gas inside the space extending from the light source LS to the optical member in the illumination optical system IL that is closest to the reticle is replaced with an inert gas such as helium gas, nitrogen gas or the like which has a low absorptivity with respect to the exposing light, or else this space is maintained in a vacuum state.

The reticle R is held parallel to the XY plane on a reticle stage RS via a reticle holder RH. The pattern that is to be transferred is formed on the reticle R; for example, a rectangular pattern area whose long side is oriented in the X direction and whose short side is oriented in the Y direction among the entire pattern area is illuminated. The reticle stage RS can be moved in two dimensions along the reticle plane (i.e., the XY plane) by the action of a driving system not shown in the figures, and the system is constructed so that the position coordinates can be measured and the position can be controlled by means of an interferometer RIF using a reticle moving mirror RM.

The light from the pattern formed on the reticle R forms a reticle-pattern image on a wafer W that is a photosensitive substrate via the projection optical system PL. This wafer W is held parallel to the XY plane on a wafer stage WS via a wafer table (wafer holder) WT. Furthermore, a pattern image is formed on the wafer W in a rectangular exposure area whose long side is oriented in the X direction and whose short side is oriented in the Y direction so that this corresponds optically to the rectangular illuminated area on the reticle R. The wafer stage WS can be moved in two dimensions along the wafer plane (i.e., the XY plane) by the action of a driving system not shown in the figures, and the system is constructed so that the position coordinates can be measured and the position can be controlled by an interferometer WIF using a wafer moving mirror WM.

Furthermore, the exposure apparatus shown in the figures is constructed so that the interior of the projection optical system PL between the optical member that is disposed closest to the reticle and the optical member that is disposed closest to the wafer among the optical members that constitute the projection optical system PL is maintained in an air-tight state. The air inside the projection optical system PL is replaced with an inert gas such as helium gas, nitrogen gas or the like, or else the interior of the projection optical system PL is maintained in a vacuum state.

Furthermore, the reticle R, reticle stage RS and the like are disposed in the narrow light path between the illumination optical system IL and projection optical system PL. The interior of the casing (not shown in the figures) that seals and surrounds the reticle R, reticle stage RS and the like is filled with an inert gas such as nitrogen gas, helium gas or the like, or else this interior of the casing is maintained in a vacuum state.

Furthermore, the wafer W, wafer stage WS and the like are disposed in the narrow light path between the projection optical system PL and the wafer W. The interior of the casing that seals and surrounds the wafer W, wafer stage WS and the like is filled with an inert gas such as nitrogen gas, helium gas or the like, or else this interior of the casing is maintained in a vacuum state. Thus, throughout the entire light path extending from the light source LS to the wafer W, an atmosphere is formed in which there is almost no absorption of the exposing light.

As was described above, the illuminated area on the reticle R and the exposed area (effectively exposed area) on the wafer W that are regulated by the projection optical system PL are rectangular areas whose short sides are oriented in the Y direction. Accordingly, the reticle pattern is scanned and exposed in the area on the wafer W, which has a width equal to the long side of the exposed area and a length equal to the amount of scanning (amount of movement) of the wafer W by synchronously moving (scanning) the reticle stage RS and wafer stage WS in the direction of the short sides of the rectangular exposed area and illuminated area, i.e., in the y direction, while controlling the positions of the reticle R and wafer W using the driving systems and interferometers (RIF, WIF).

Figure 2:
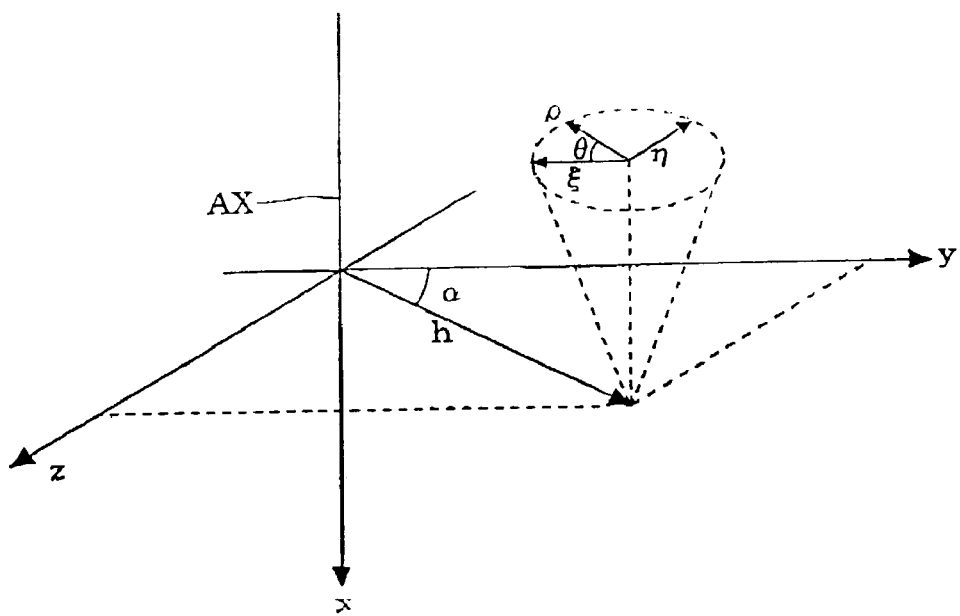
FIG. 2 is a diagram-which illustrates the image plane coordinates and pupil coordinates of the projection optical system PL.

In the present embodiment, the evaluation method and adjustment method of the present invention are applied to a projection optical system PL as an imaging optical system. Before this application is described, an aberration polynomial (aberration function) that generally expresses the aberration of the projection optical system PL as a function of the image plane coordinates and pupil coordinates will be newly set. FIG. 2 is a diagram which illustrates the image plane coordinates and pupil coordinates of the projection optical system PL. Noting the light rays that pass through the image plane orthogonal coordinates (y, z) and pupil orthogonal coordinates ($\xi$, $\eta$) in FIG. 2, it should be possible to develop the wavefront aberration (or optical path difference) W of these light rays as a power series of y, z, $\xi$, $\eta$.

First, the rotational symmetric aberration component Wr relating to the optical axis AX of the projection optical system PL among the respective components of the wavefront aberration W is explained. The invariable quantities with respect to the rotation of the coordinates can be expressed by the following equations (1) through (3) Furthermore, the rotational symmetric aberration component Wr can be expressed as a power series of the invariable quantity of equation (1), the invariable quantity of equation (2) and the invariable quantity of equation (3). In other words, the rotational symmetric aberration component Wr can be expressed as {power series of (1) through (3)}.

$$y^2 + z^2 \quad (1)$$

$$\xi^2 + \eta^2 \quad (2)$$

$$y \cdot \xi + z \cdot \eta \quad (3)$$

Next, among the respective components of the wavefront aberration W, the decentering aberration component Ws relating to the optical axis AX of the projection optical system PL is explained. The coordinate (image plane coordinate or pupil coordinate) dependence of the aberration component that is newly generated by eccentricity is linear only. Accordingly, the aberration component containing an eccentric component, i.e., the decentering aberration component Ws, can be expressed as the product of any one of the linear coordinate dependent components expressed by the following equations (4) through (7) and a power series of the invariable quantities with respect to the rotation expressed by equations (1) through (3). In other words, the decentering aberration component Ws can be expressed as {power series of (1) through (3)}×{anyone of (4) through (7)}.

$$y \quad (4)$$

$$z \quad (5)$$

$$\xi \quad (6)$$

$$\eta \quad (7)$$

Finally, among the respective components of the wavefront aberration W, the astigmatic aberration component Wa is explained. The coordinate (image plane coordinate or pupil coordinate) dependence of an aberration component newly generated by astigmatism is quadratic only, and is a 180-degree periodic function with respect to the rotation of the coordinates. Accordingly, aberration component containing an astigmatic component, i.e., the astigmatic aberration component Wa, can be expressed as the product of any one of the quadratic dependent components of the coordinates which are expressed by the following equations (8) through (13), and which are 180-degree periodic functions with respect to the rotation of the coordinates, and a power series of the invariable quantities with respect to the rotation that are expressed by equations (1) through (3). In other words, the astigmatic aberration component Wa can be expressed as {power series of (1) through (3)}×(any one of (8) through (13)}.

$$y^2 - z^2 \tag{8}$$

$$2y \cdot z \tag{9}$$

$$\xi^2 - \eta^2 \tag{10}$$

$$2\xi \cdot \eta \tag{11}$$

$$y \cdot \xi - z \cdot \eta \tag{12}$$

$$y \cdot \eta + z \cdot \xi \tag{13}$$

Thus, the wavefront aberration W including the rotational symmetric aberration component Wr, the decentering aberration component Ws and the astigmatic aberration component Wa can be expressed as {power series of (1) through (3)}, or {power series of (1) through (3)}×{any one of (4) through (13)}. Meanwhile, referring to FIG. 2, the relationship between the image plane orthogonal coordinates (y, z) and the image plane polar coordinates (h, α), and the relationships between the pupil orthogonal coordinates (ξ, η) and the pupil polar coordinates (ρ, θ) shown in the following equations (a) through (d) is obtained. Here, h and ρ indicated the standardized radius, and α and θ indicate the polar angle of the polar coordinates.

$$y = h \cos \alpha \tag{a}$$

$$z = h \sin \alpha \tag{b}$$

$$\xi = \rho \cos \theta \tag{c}$$

$$\eta = \rho \sin \theta \tag{d}$$

Accordingly, the abovementioned equations (1) through (13) can be transformed into the following equations (A) through (M) on the basis of the relationships shown in the equations (a) through (d).

$$y^2 + z^2(1) \rightarrow h^2 \tag{A}$$

$$\xi^2 + \eta^2(2) \rightarrow \rho^2 \tag{B}$$

$$y \cdot \xi + z \cdot \eta(3) \rightarrow \rho h \cos(\theta - \alpha) \tag{C}$$

$$y(4) \rightarrow h \cos \alpha \tag{D}$$

$$z(5) \rightarrow h \sin \alpha \tag{E}$$

$$\xi(6) \rightarrow \rho \cos \theta \tag{F}$$

$$\eta(7) \rightarrow \rho \sin \theta \tag{G}$$

$$y^2 - z^2(8) \rightarrow h^2 \cos 2\alpha \tag{H}$$

$$2y \cdot z(9) \rightarrow h^2 \sin 2\alpha \tag{I}$$

$$\xi^2 - \eta^2(10) \rightarrow \rho^2 \cos 2\theta \tag{J}$$

$$2\xi \cdot \eta(11) \rightarrow \rho^2 \sin 2\theta \tag{K}$$

$$y \cdot \xi - z \cdot \eta(12) \rightarrow h \rho \cos(\theta + \alpha) \tag{L}$$

$$y \cdot \eta + z \cdot \xi(13) \rightarrow h \rho \sin(\theta + \alpha) \tag{M}$$

Accordingly, the wavefront aberration including the rotational symmetric aberration component Wr, the decentering aberration component Ws and the astigmatic aberration component Wa can be expressed as the following aberration polynomial (e).

$$W = \Sigma(Mi \cdot FMi)$$

Here, $$FMi = \left(A^{j1} \cdot B^{j2} \cdot C^{j3}\right) \times \{D^{k1} \cdot E^{k2} \cdot F^{k3} \cdot G^{k4}\} \times (H^{k5} \cdot I^{k6} \cdot J^{k7} \cdot K^{k8} \cdot L^{k9} \cdot M^{k10})\} \tag{e}$$

Here, τ is a sum symbol relating to positive integers i (i=1, 2, 3, ... ), and Mi and FMi are the coefficients and functions of the respective terms in the aberration polynomial Σ(Mi·FMi) Furthermore, j1 through j3 are non-negative integers (0, 1, 2, ... ). Moreover, k1 through k10 are 0 or 1, and satisfy the condition Σki≦1. In other words, k1 through k10 are all zero, or else only one of these values is 1, and the remaining values are all zero. In concrete terms, in a case where k1 through k10 are all zero, the terms express the rotational symmetric aberration component Wr. On the other hand, in a case where only one of k1 through k10 is 1, the terms express the decentering aberration component Ws or the astigmatic aberration component Wa.

The classification of aberration corresponding to the functions FMi of the respective terms in the aberration polynomial Σ(Mi·FMi), the order numbers of this aberration, and the combinations of order numbers of j1 through j3 and k1 through k10 (blank spaces in the respective tables are zero) are shown in the following tables (1) through (3). Here, the combinations of order numbers of j1 through j3 and k1 through k10 are regulated so that the functions FMi of the respective terms other than the constant term FM1 include at least ρ. Furthermore, in the classification of the aberration, dist. indicates distortion and M-indicates the meridional direction. Moreover, if any one of j1 through j3 is 1, the aberration order number increases by 2, if any one of k1 through k4 is 1, the aberration order number increases by 1, and if any one of k5 through k10 is 1, the aberration order number increases by 2. Furthermore, in Tables (1) through (3), an indication of the functions FMi beyond the $102^{nd}$ term is omitted.

TABLE 1

| FMi | CLASSIFICATION OF ABERRATION | ORDER NUMBER OF ABERRATION | J1 | J2 | J3 | k1 | k2 | k3 | k4 | k5 | k6 | k7 | k8 | k9 | k10 |
|---|---|---|---|---|---|---|---|---|---|---|---|---|---|---|---|
| FM1 | CONSTANT TERM (PISTON) | 0 | | | | | | | | | | | | | |
| FM2 | IMAGE SHIFT (y) | 1 | | | | | 1 | | | | | | | | |
| FM3 | IMAGE SHIFT (z) | 1 | | | | | | | 1 | | | | | | |
| FM4 | FOCUS | 2 | | | 1 | | | | | | | | | | |
| FM5 | MAGNIFICATION | 2 | | | | 1 | | | | | | | | | |
| FM6 | CENTER ASTIGMATISM 1 | 2 | | | | | | | | | | 1 | | | |
| FM7 | CENTER ASTIGMATISM 2 | 2 | | | | | | | | | | | 1 | | |
| FM8 | RECTANGULAR Dist. | 2 | | | | | | | | | | | | 1 | |
| FM9 | RHOMBOID Dist. | 2 | | | | | | | | | | | | | 1 |
| FM10 | DECENTERING Dist. (y) | 3 | 1 | | | | 1 | | | | | | | | |
| FM11 | DECENTERING Dist. (z) | 3 | 1 | | | | | | 1 | | | | | | |
| FM12 | IMAGE PLANE TILT (y) | 3 | | 1 | | 1 | | | | | | | | | |
| FM13 | IMAGE PLANE TILT (z) | 3 | | 1 | | | | 1 | | | | | | | |
| FM14 | DECENTERING COMA (y) | 3 | | 1 | | | 1 | | | | | | | | |
| FM15 | DECENTERING COMA (z) | 3 | | 1 | | | | | 1 | | | | | | |
| FM16 | M-Dist. (y) | 3 | | | 1 | 1 | | | | | | | | | |
| FM17 | M-Dist. (z) | 3 | | | 1 | | | 1 | | | | | | | |
| FM18 | DECENTERING ASTIGMATISM (y) | 3 | | 1 | | | 1 | | | | | | | | |
| FM19 | DECENTERING ASTIGMATISM (z) | 3 | | 1 | | | | | 1 | | | | | | |
| FM20 | IMAGE PLANE CURVATURE | 4 | 1 | 1 | | | | | | | | | | | |
| FM21 | Dist. | 4 | 1 | | 1 | | | | | | | | | | |
| FM22 | COMATIC ABERRATION | 4 | | 1 | 1 | | | | | | | | | | |
| FM23 | SPHERICAL ABERRATION | 4 | | 2 | | | | | | | | | | | |
| FM24 | NON-POINT ABERRATION | 4 | | | 2 | | | | | | | | | | |
| FM25 | SADDLE TYPE ASTIGMATISM (y) | 4 | 1 | | | | | | | | | 1 | | | |
| FM26 | SADDLE TYPE ASTIGMATISM (z) | 4 | 1 | | | | | | | | | | 1 | | |
| FM27 | FOURTH-ORDER RECTANGULAR Dist. 1 (y) | 4 | 1 | | | | | | | | | | | 1 | |
| FM28 | FOURTH-ORDER RHOMBOID Dist. 1 (z) | 4 | 1 | | | | | | | | | | | | 1 |
| FM29 | SADDLE TYPE CURVATURE (y) | 4 | | 1 | | | | | | 1 | | | | | |
| FM30 | SADDLE TYPE CURVATURE (z) | 4 | | 1 | | | | | | | 1 | | | | |
| FM31 | FIFTH-ORDER CENTER ASTIGMATISM 1 | 4 | | 1 | | | | | | | | 1 | | | |
| FM32 | FIFTH-ORDER CENTER ASTIGMATISM 2 | 4 | | 1 | | | | | | | | | 1 | | |
| FM33 | RECTANGULAR COMA (y) | 4 | | 1 | | | | | | | | | | 1 | |
| FM34 | RHOMBOID COMA (z) | 4 | | 1 | | | | | | | | | | | 1 |
| FM35 | FOURTH-ORDER RECTANGULAR Dist. 2 (y) | 4 | | | 1 | | | | | 1 | | | | | |
| FM36 | FOURTH-ORDER RHOMBOID Dist. 2 (z) | 4 | | | 1 | | | | | | 1 | | | | |
| FM37 | RECTANGULAR 3θ | 4 | | | 1 | | | | | | | 1 | | | |
| FM38 | RHOMBOID 3θ | 4 | | | 1 | | | | | | | | 1 | | |
| FM39 | SADDLE TYPE ASTIGMATISM (y) | 4 | | | 1 | | | | | | | | | 1 | |
| FM40 | SADDLE TYPE ASTIGMANTISM (z) | 4 | | | 1 | | | | | | | | | | 1 |

TABLE 2

| FMi | CLASSIFICATION OF ABERRATION | ORDER NUMBER OF ABERRATION | J1 | J2 | J3 | k1 | k2 | k3 | k4 | k5 | k6 | k7 | k8 | k9 | k10 |
|---|---|---|---|---|---|---|---|---|---|---|---|---|---|---|---|
| FM41 | FIFTH-ORDER IMAGE PLANE TILT (y) | 5 | 1 | 1 | | 1 | | | | | | | | | |
| FM42 | FIFTH-ORDER IMAGE PLANE TILT (z) | 5 | 1 | 1 | | | 1 | | | | | | | | |
| FM43 | DECENTERING COMATIC UNDULATION (y) | 5 | 1 | 1 | | | | 1 | | | | | | | |
| FM44 | DECENTERING COMATIC UNDULATION (z) | 5 | 1 | 1 | | | | | 1 | | | | | | |
| FM45 | FIFTH-ORDER M-Dist. (y) | 5 | 1 | | 1 | 1 | | | | | | | | | |
| FM46 | FIFTH-ORDER M-Dist. (z) | 5 | 1 | | 1 | | 1 | | | | | | | | |
| FM47 | DECENTERING ASTIGMATIC UNDULATION 1 (y) | 5 | 1 | 1 | | | | 1 | | | | | | | |
| FM48 | DECENTERING ASTIGMATIC UNDULATION 1 (z) | 5 | 1 | 1 | | | | | 1 | | | | | | |
| FM49 | FIFTH-ORDER DECENTERING Dist. (y) | 5 | 2 | | | | | 1 | | | | | | | |
| FM50 | FIFTH-ORDER DECENTERING Dist. (z) | 5 | 2 | | | | | | 1 | | | | | | |
| FM51 | M-Coma (y) | 5 | | 1 | 1 | 1 | | | | | | | | | |
| FM52 | M-Coma (z) | 5 | | 1 | 1 | | 1 | | | | | | | | |
| FM53 | FIFTH-ORDER ASTIGMATIC DECENTERING COMPONENT (y) | 5 | | 1 | 1 | | | 1 | | | | | | | |
| FM54 | FIFTH-ORDER ASTIGMATIC DECENTERING COMPONENT (z) | 5 | | 1 | 1 | | | | 1 | | | | | | |
| FM55 | SPHERICAL ABERRATION TILT (y) | 5 | | 2 | | 1 | | | | | | | | | |
| FM56 | SPHERICAL ABERRATION TILT (z) | 5 | | 2 | | | 1 | | | | | | | | |

TABLE 2-continued

| FMi | CLASSIFICATION OF ABERRATION | ORDER NUMBER OF ABERRATION | J1 | J2 | J3 | k1 | k2 | k3 | k4 | k5 | k6 | k7 | k8 | k9 | k10 |
|---|---|---|---|---|---|---|---|---|---|---|---|---|---|---|---|
| FM57 | FIFTH-ORDER DECENTERING COMA (y) | 5 |  | 2 |  |  | 1 |  |  |  |  |  |  |  |  |
| FM58 | FIFTH-ORDER DECENTERING COMA (z) | 5 |  | 2 |  |  |  | 1 |  |  |  |  |  |  |  |
| FM59 | DECENTERING ASTIGMATIC UNDULATION 2 (y) | 5 |  |  |  | 2 | 1 |  |  |  |  |  |  |  |  |
| FM60 | DECENTERING ASTIGMATIC UNDULATION 2 (z) | 5 |  |  |  | 2 |  | 1 |  |  |  |  |  |  |  |
| FM61 | DECENTERING 3 θ (y) | 5 |  |  |  | 2 | 1 |  |  |  |  |  |  |  |  |
| FM62 | DECENTERING 3 θ (z) | 5 |  |  |  | 2 |  | 1 |  |  |  |  |  |  |  |
| FM63 | COMATIC UNDULATION | 6 | 1 | 1 | 1 |  |  |  |  |  |  |  |  |  |  |
| FM64 | SPHERICAL ABERRATION CURVATURE | 6 | 1 | 2 |  |  |  |  |  |  |  |  |  |  |  |
| FM65 | ASTIGMATIC UNDULATION | 6 | 1 |  |  | 2 |  |  |  |  |  |  |  |  |  |
| FM66 | CURVATURE UNDULATION | 6 | 2 | 1 |  |  |  |  |  |  |  |  |  |  |  |
| FM67 | FIFTH-ORDER Dist. | 6 | 2 |  |  | 1 |  |  |  |  |  |  |  |  |  |
| FM68 | FIFTH-ORDER ASTIGMATISM | 6 |  | 1 |  | 2 |  |  |  |  |  |  |  |  |  |
| FM69 | FIFTH-ORDER COMA | 6 |  | 2 |  | 1 |  |  |  |  |  |  |  |  |  |
| FM70 | FIFTH-ORDER SPHERICAL ABERRATION | 6 |  | 3 |  |  |  |  |  |  |  |  |  |  |  |
| FM71 | 3 θ | 6 |  |  |  | 3 |  |  |  |  |  |  |  |  |  |
| FM72 | . | 6 | 1 | 1 |  |  |  |  | 1 |  |  |  |  |  |  |
| FM73 | . | 6 | 1 | 1 |  |  |  |  |  | 1 |  |  |  |  |  |
| FM74 | . | 6 | 1 | 1 |  |  |  |  |  |  | 1 |  |  |  |  |
| FM75 | . | 6 | 1 | 1 |  |  |  |  |  |  |  | 1 |  |  |  |
| FM76 | . | 6 | 1 | 1 |  |  |  |  |  |  |  |  | 1 |  |  |
| FM77 | . | 6 | 1 | 1 |  |  |  |  |  |  |  |  |  |  | 1 |
| FM78 | . | 6 | 1 |  | 1 |  |  |  | 1 |  |  |  |  |  |  |
| FM79 | . | 6 | 1 |  | 1 |  |  |  |  | 1 |  |  |  |  |  |
| FM80 | . | 6 | 1 |  | 1 |  |  |  |  |  | 1 |  |  |  |  |
| FM81 | . | 6 | 1 |  | 1 |  |  |  |  |  |  | 1 |  |  |  |

TABLE 3

| FMi | CLASSIFICATION OF ABERRATION | ORDER NUMBER OF ABERRATION | J1 | J2 | J3 | k1 | k2 | k3 | k4 | k5 | k6 | k7 | k8 | k9 | k10 |
|---|---|---|---|---|---|---|---|---|---|---|---|---|---|---|---|
| FM82 | . | 6 | 1 | 1 |  |  |  |  |  |  |  |  | 1 |  |  |
| FM83 | . | 6 | 1 | 1 |  |  |  |  |  |  |  |  |  | 1 |  |
| FM84 | . | 6 |  | 1 | 1 |  |  |  | 1 |  |  |  |  |  |  |
| FM85 | . | 6 |  | 1 | 1 |  |  |  |  | 1 |  |  |  |  |  |
| FM86 | . | 6 |  | 1 | 1 |  |  |  |  |  | 1 |  |  |  |  |
| FM87 | . | 6 |  | 1 | 1 |  |  |  |  |  |  | 1 |  |  |  |
| FM88 | . | 6 |  | 1 | 1 |  |  |  |  |  |  |  | 1 |  |  |
| FM89 | . | 6 |  | 1 | 1 |  |  |  |  |  |  |  |  | 1 |  |
| FM90 | . | 6 |  | 2 |  |  |  |  | 1 |  |  |  |  |  |  |
| FM91 | . | 6 |  | 2 |  |  |  |  |  | 1 |  |  |  |  |  |
| FM92 | . | 6 |  | 2 |  |  |  |  |  |  | 1 |  |  |  |  |
| FM93 | . | 6 |  | 2 |  |  |  |  |  |  |  | 1 |  |  |  |
| FM94 | . | 6 |  | 2 |  |  |  |  |  |  |  |  | 1 |  |  |
| FM95 | . | 6 |  | 2 |  |  |  |  |  |  |  |  |  |  | 1 |
| FM96 | . | 6 |  |  | 2 |  |  |  | 1 |  |  |  |  |  |  |
| FM97 | . | 6 |  |  | 2 |  |  |  |  | 1 |  |  |  |  |  |
| FM98 | . | 6 |  |  | 2 |  |  |  |  |  | 1 |  |  |  |  |
| FM99 | . | 6 |  |  | 2 |  |  |  |  |  |  | 1 |  |  |  |
| FM100 | . | 6 |  |  | 2 |  |  |  |  |  |  |  | 1 |  |  |
| FM101 | . | 6 |  |  | 2 |  |  |  |  |  |  |  |  |  | 1 |

Next, in accordance with Tables (1) through (3) the functions FMi of the respective terms in the aberration polynomial are expressed as image plane orthogonal coordinates (z, y) and pupil polar coordinates ($\rho$, $\theta$), and are shown in the following Table (4). Table (4), an indication of the functions FMi beyond the $72^{nd}$ term is omitted.

TABLE 4

| | |
|---|---|
| FM1: | 1 |
| FM2: | $\rho \times \cos\theta$ |
| FM3: | $\rho \times \sin\theta$ |
| FM4: | $\rho^2$ |

TABLE 4-continued

| | |
|---|---|
| FM5: | $y \times \rho \times \cos\theta + z \times \rho \times \sin\theta$ |
| FM6: | $\rho^2 \times \cos2\theta$ |
| FM7: | $\rho^2 \times \sin2\theta$ |
| FM8: | $y \times \rho \times \cos\theta - z \times \rho \times \sin\theta$ |
| FM9: | $z \times \rho \times \cos\theta + y \times \rho \times \sin\theta$ |
| FM10: | $(y^2 + z^2) \times \rho \times \cos\theta$ |
| FM11: | $(y^2 + z^2) \times \rho \times \sin\theta$ |
| FM12: | $y \times \rho^2$ |
| FM13: | $z \times \rho^2$ |
| FM14: | $\rho^3 \times \cos\theta$ |
| FM15: | $\rho^3 \times \sin\theta$ |
| FM16: | $y^2 \times \rho \cos\theta + y \times z \times \rho \times \sin\theta$ |
| FM17: | $y \times z \times \rho \times \cos\theta + z^2\rho \times \sin\theta$ |
| FM18: | $-1/2 \times y \times \rho^2 + 1/2 \times y \times \rho^2 \times \cos2\theta +$ $1/2 \times z \times \rho^2 \times \sin2\theta$ |
| FM19: | $1/2 \times z \times \rho^2 - 1/2 \times z \times \rho^2 \times \cos2\theta +$ $1/2 \times y \times \rho^2 \times \sin2\theta$ |
| FM20: | $(y^2 + z^2) \times \rho^2$ |
| FM21: | $(y^2 + z^2) \times y \times \rho \times \cos\theta + (y^2 + z^2) \times z \times \rho \times \sin\theta$ |
| FM22: | $y \times \rho^3 \times \cos\theta + z \times \rho^3 \times \sin\theta$ |
| FM23: | $\rho^4$ |
| FM24: | $1/2 \times (y^2 + z^2) \times \rho^2 +$ $1/2 \times (y^2 - z^2) \times \rho^2 \times \cos2\theta +$ $y \times z \times \rho^2 \times \sin2\theta$ |
| FM25: | $(y^2 + z^2) \times \rho^2 \times \cos2\theta$ |
| FM26: | $(y^2 + z^2) \times \rho^2 \times \sin2\theta$ |
| FM27: | $(y^2 + z^2) \times y \times \rho \times \cos\theta - (y^2 + z^2) \times z \times \rho \times \sin\theta$ |
| FM28: | $(y^2 + z^2) \times z \times \rho \times \cos\theta + (y^2 + z^2) \times y \times \rho \times \sin\theta$ |
| FM29: | $(y^2 + z^2) \times \rho^2$ |
| FM30: | $2 \times y \times z \times \rho^2$ |
| FM31: | $\rho^4 \times 2\cos\theta$ |
| FM32: | $\rho^4 \times 2\cos\theta$ |
| FM33: | $y \times \rho^3 \times \cos\theta - z \times \rho^3 \times \sin\theta$ |
| FM34: | $z \times \rho^3 \times \cos\theta + y \times \rho^3 \times \sin\theta$ |
| FM35: | $(y^2 + z^2) \times y \times \rho \times \cos\theta + (y^2 - z^2) \times z \times \rho \times \sin\theta$ |
| FM36: | $2 \times y^2 \times z \times \rho \times \cos\theta + 2 \times y \times z^2 \times \rho \times \sin\theta$ |
| FM37: | $1/2 \times (y \times \rho^3 \times (\cos3\theta + \cos\theta) +$ $z \times \rho^3 \times (\sin3\theta - \sin\theta))$ |
| FM38: | $-1/2 \times (z \times \rho^3 \times (\cos3\theta - \cos\theta) -$ $y \times \rho^3 \times (\sin3\theta + \sin\theta))$ |
| FM39: | $1/2 \times (y^2 \times (\rho^2 \cos2\theta + \rho^2) +$ $z^2 \times (\rho^2 \cos2\theta - \rho^2))$ |
| FM40: | $y \times z \times \rho^2 + 1/2 \times \rho^2 \times (y^2 + z^2) \times \sin2\theta$ |
| FM41: | $(y^2 + z^2) \times y \times \rho^2$ |
| FM42: | $(y^2 + z^2) \times z \times \rho^2$ |
| FM43: | $(y^2 + z^2) \times \rho^3 \times \cos\theta$ |
| FM44: | $(y^2 + z^2) \times \rho^3 \times \sin\theta$ |
| FM45: | $(y^2 + z^2) \times y^2 \times \rho \times \cos\theta +$ $(y^2 + z^2) \times y \times z \times \rho \times \sin\theta$ |
| FM46: | $(y^2 + z^2) \times y \times z \times \rho \times \cos\theta +$ $(y^2 + z^2) \times z^2 \times \rho \times \sin\theta$ |
| FM47: | $1/2 \times (y^2 + z^2) \times y \times \rho^2 +$ $1/2 \times (y^2 + z^2) \times y \times \rho^2 \times \cos2\theta +$ $1/2 \times (y^2 + z^2) \times z \times \rho^2 \times \sin2\theta$ |
| FM48: | $1/2 \times (y^2 + z^2) \times z \times \rho^2 -$ $1/2 \times (y^2 + z^2) \times z \times \rho^2 \times \cos2\theta +$ $1/2 \times (y^2 + z^2) \times y \times \rho^2 \times \sin2\theta$ |
| FM49: | $(y^2 + z^2)^2 \times \rho \times \cos\theta$ |
| FM50: | $(y^2 + z^2)^2 \times \rho \times \sin\theta$ |
| FM51: | $y^2 \times \rho^3 \times \cos\theta + y \times z \times \rho^3 \times \sin\theta$ |
| FM52: | $y \times z \times \rho^3 \times \cos\theta + z^2 \times \rho^3 \times \sin\theta$ |
| FM53: | $1/2 \times y \times \rho^4 + 1/2 \times y \times \rho^4 \times \cos2\theta +$ $1/2 \times z \times \rho^4 \times \sin2\theta$ |
| FM54: | $1/2 \times z \times \rho^4 - 1/2 \times z \times \rho^4 \times \cos2\theta +$ $1/2 \times y \times \rho^4 \times \sin2\theta$ |
| FM55: | $y \times \rho^4$ |
| FM56: | $z \times \rho^4$ |
| FM57: | $\rho^5 \times \cos\theta$ |
| FM58: | $\rho^5 \times \sin\theta$ |
| FM59: | $1/2 \times (y^2 + z^2) \times y \times \rho^2 +$ $1/2 \times (y^2 - z^2) \times y \times \rho^2 \times \cos2\theta +$ $y^2 \times z \times \rho^2 \times \sin2\theta$ |
| FM60: | $1/2 \times (y^2 + z^2) \times z \times \rho^2 +$ $1/2 \times (y^2 - z^2) \times z \times \rho^2 \times \cos2\theta +$ $y \times z^2 \times \rho^2 \times \sin2\theta$ |
| FM61: | $(y^2 + z^2) \times \rho^3 \times \cos\theta +$ $1/4 \times (y^2 - z^2) \times (\rho^3 \times \cos3\theta + \rho^3 \times \cos\theta) +$ $1/2 \times y \times z \times (\rho^3 \times \sin3\theta + \rho^3 \times \sin\theta)$ |
| FM62: | $(y^2 + z^2) \times \rho^3 \times \sin\theta -$ $1/2 \times y \times z \times (\rho^3 \times \cos3\theta - \rho^3\cos\theta) +$ $1/4 \times (y^2 - z^2) \times (\rho^3 \times \sin3\theta - \rho^3 \times \sin\theta)$ |
| FM63: | $(y^2 + z^2) \times y \times \rho^3 \times \cos\theta + (y^2 + z^2) \times z \times \rho^3 \times \sin\theta$ |
| FM64: | $(y^2 + z^2) \times \rho^4$ |
| FM65: | $1/2 \times (y^2 + z^2)^2 \times \rho^2 +$ $1/2 \times (y^4 - z^4) \times \rho^2 \times \cos2\theta +$ $(y^2 + z^2) \times y \times z \times \rho^2 \times \sin2\theta$ |
| FM66: | $(y^2 + z^2)^2 \times \rho^2$ |
| FM67: | $(y^2 + z^2)^2 \times y \times \rho \times \cos\theta + (y^2 + z^2)^2 \times z \times \rho \times \sin\theta$ |
| FM68: | $1/2 \times (y^2 + z^2) \times \rho^4 +$ $1/2 \times (y^2 - z^2) \times \rho^4 \times \cos2\theta +$ $y \times z \times \rho^4 \times \sin2\theta$ |
| FM69: | $y \times \rho^5 \times \cos\theta + z \times \rho^5 \times \sin\theta$ |
| FM70: | $\rho^6$ |
| FM71: | $1/4 \times y \times (y^2 - 3 \times z^2) \times \rho^3 \times \cos3\theta -$ $1/4 \times z \times (z^2 - 3 \times y^2) \times \rho^3 \times \sin3\theta +$ $3/4 \times y \times (y^2 + z^2) \times \rho^3 \times \cos\theta +$ $3/4 \times z \times (y^2 + z^2) \times \rho^3 \times \sin\theta$ |

Here, the basic explanation regarding the Zernike polynomial that expresses the distribution of the wavefront aberration within the pupil will be provided. In this expression by means of a Zernike polynomial, the abovementioned pupil polar coordinates ($\rho$, $\theta$) are used as the coordinate system, and a Zernike cylindrical function is used as an orthogonal function system. Specifically, the wavefront aberration W ($\rho$, $\theta$) is developed as shown in the following equation (f) using the Zernike cylindrical function $Zi(\rho, \theta)$ $$W(\rho, \theta) = \Sigma Ci \cdot Zi(\rho, \theta) \qquad (f)$$
$$= C1 \ldots Z1(\rho, \theta) + C2 \cdot Z2(\rho, \theta) \ldots + Cn \cdot Zn(\rho, \theta)$$

Here, $Ci$ indicates the coefficients of the respective terms of the Zernike polynomial. The functions Z1 through Z36 of the first through $36^{th}$ terms (in the function system $Zi(\rho, \theta)$) of the respective terms of the Zernike polynomial) are shown in Table 5 below.

TABLE 5

| | |
|---|---|
| z1: | 1 |
| Z2: | $\rho\cos\theta$ |
| Z3: | $\rho\sin\theta$ |
| Z4: | $2\rho^2 - 1$ |
| Z5: | $\rho^2\cos2\theta$ |
| Z6: | $\rho^2\sin2\theta$ |
| Z7: | $(3\rho^2 - 2) \rho\cos\theta$ |
| Z8: | $(3\rho^2 - 2) \rho\sin\theta$ |
| Z9: | $6\rho^4 - 6\rho^2 + 1$ |
| Z10: | $\rho^3\cos3\theta$ |
| Z11: | $\rho^3\sin3\theta$ |
| Z12: | $(4\rho^2 - 3) \rho^2\cos2\theta$ |
| Z13: | $(4\rho^2 - 3) \rho^2\sin2\theta$ |
| Z14: | $(10\rho^4 - 12\rho^2 + 3) \rho\cos\theta$ |
| Z15: | $(10\rho^4 - 12\rho^2 + 3) \rho\sin\theta$ |
| Z16: | $20\rho^6 - 30\rho^4 + 12\rho^2 - 1$ |
| Z17: | $\rho^4\cos4\theta$ |
| Z18: | $\rho^4\sin4\theta$ |
| Z19: | $(5\rho^2 - 4) \rho^3\cos3\theta$ |
| Z20: | $(5\rho^2 - 4) \rho^3\sin3\theta$ |
| Z21: | $(15\rho^4 - 20\rho^2 + 6) \rho^2\cos2\theta$ |
| Z22: | $(15\rho^4 - 20\rho^2 + 6) \rho^2\sin2\theta$ |
| Z23: | $(35\rho^6 - 60\rho^4 + 30\rho^2 - 4) \rho\cos\theta$ |
| Z24: | $(35\rho^6 - 60\rho^4 + 30\rho^2 - 4) \rho\sin\theta$ |
| Z25: | $70\rho^8 - 140\rho^6 + 90\rho^4 - 20\rho^2 + 1$ |
| Z26: | $\rho^5\cos5\theta$ |
| Z27: | $\rho^5\sin5\theta$ |
| Z28: | $(6\rho^2 - 5) \rho^4\cos4\theta$ |
| Z29: | $(6\rho^2 - 5) \rho^4\sin4\theta$ |

TABLE 5-continued

Z30: $(21\rho^4 - 30\rho^2 + 10) \rho^3 \cos3\theta$
Z31: $(21\rho^4 - 30\rho^2 + 10) \rho^3 \sin3\theta$
Z32: $(56\rho^6 - 104\rho^4 + 60\rho^2 - 10) \rho^2 \cos2\theta$
Z33: $(56\rho^6 - 104\rho^4 + 60\rho^2 - 10) \rho^2 \sin2\theta$
Z34: $(126\rho^8 - 280\rho^6 + 210\rho^4 - 60\rho^2 + 5) \rho\cos\theta$
Z35: $(126\rho^8 - 280\rho^6 + 210\rho^4 - 60\rho^2 + 5) \rho\sin\theta$
Z36: $252\rho^{10} - 630\rho^8 + 560\rho^6 - 210\rho^4 + 30\rho^2 - 1$ Next, the functions FMi of the respective terms of the aberration polynomial Σ(Mi·Fi) shown in Table (4) are transformed into a configuration of linear coupling of the functions Zi of the respective terms of the Zernike polynomial shown in Table (5); this is shown in Table (6) below as new functions Fi for the aberration polynomial. Furthermore, in the transformation of the functions FMi of the respective terms, Zernike functions Zi in which the order number of ρ and the order number of θ are the same, and in which the distinction of sin and cos are the same, are introduced for permutation.

Furthermore, in cases where the function Fi of a certain term contains the function Fj of another term as a result of the transformation of the functions FMi of the respective terms, the portion corresponding to the function Fj is omitted from the function Fi in order to avoid redundancy. In concrete terms, referring to FM4 and Z4 as the simplest example, the function F4 of the fourth term is initially (Z4−Z1); however, since this includes the function F1=Z1 of another term (the first term), the portion Z1 corresponding to the function F1 is omitted from the function F4, so that the function F4=Z4.

Furthermore, in cases where the function Fi of a certain term coincides with the function Fj of another term as a result of the transformation of the functions FMi of the respective terms, the use of the function Fj is omitted in order to avoid redundancy. In concrete terms, referring to Table (6), the functions F39 and F40 of the 39$^{th}$ and 40$^{th}$ terms respectively coincide with the functions F25 and F26 of the 25$^{th}$ and 26$^{th}$ terms, accordingly, the functions F39 and F40 of the 39$^{th}$ and 40$^{th}$ terms are not used in the aberration polynomial Σ(Mi·Fi). Furthermore, in Table (6), the functions Fi beyond the 72$^{nd}$ term are not indicated.

TABLE 6

F1: Z1
F2: Z2
F3: Z3
F4: Z4
F5: $y \times Z2 + z \times Z3$
F6: Z5
F7: Z6
F8: $y \times Z2 - z \times Z3$
F9: $z \times Z2 + y \times Z3$
F10: $(y^2 + z^2) \times Z2$
F11: $(y^2 + z^2) \times Z3$
F12: $y \times Z4$
F13: $z \times Z4$
F14: Z7
F15: Z8
F16: $y^2 \times Z2 + y \times Z3$
F17: $y \times z \times Z2 + z^2 \times Z3$
F18: $y \times Z5 + z \times Z6$
F19: $-z \times Z5 + y \times Z6$
F20: $(y^2 + z^2) \times Z4$
F21: $(y^2 + z^2) \times y \times Z2 + (y^2 + z^2) z \times Z3$
F22: $y \times Z7 + z \times Z8$
F23: Z9
F24: $(y^2 - z^2) \times Z5 + 2 \times y \times z \times Z6$
F25: $(y^2 + z^2) \times Z5$ TABLE 6-continued F26: $(y^2 + z^2) \times Z6$
F27: $(y^2 + z^2) \times y \times Z2 - (y^2 + z^2) \times z \times Z3$
F28: $(y^2 + z^2) \times z \times Z2 + (y^2 + z^2) \times y \times Z3$
F29: $(y^2 - z^2) \times Z4$
F30: $2 \times y \times z \times Z4$
F31: Z12
F32: Z13
F33: $y \times Z7 - z \times Z8$
F34: $z \times Z7 + y \times 38$
F35: $(y^2 - z^2) \times y \times Z2 + (y^2 - z^2) \times z \times Z3$
F36: $2 \times y^2 \times z \times Z2 + 2 \times y \times z^2 \times Z3$
F37: $y \times Z10 + z \times Z11$
F38: $-z \times Z10 + y \times Z11$
F39: $(y^2 + z^2) \times Z5$
F40: $(y^2 + z^2) \times Z6$
F41: $(y^2 + z^2) \times y \times Z4$
F42: $(y^2 + z^2) \times z \times Z4$
F43: $(y^2 + z^2) \times Z7$
F44: $(y^2 + z^2) \times Z8$
F45: $(y^2 + z^2) \times y^2 \times Z2 + (y^2 + z^2) \times y \times z \times Z3$
F46: $(y^2 + z^2) \times y \times z \times Z2 + (y^2 + z^2) \times z^2 \times Z3$
F47: $(y^2 + z^2) \times y \times Z5 + (y^2 + z^2) \times z \times Z6$
F48: $-(y^2 + z^2) \times z \times Z5 + (y^2 + z^2) \times y \times Z6$
F49: $(y^2 + z^2)^2 \times Z2$
F50: $(y^2 + z^2)^2 \times Z3$
F51: $y^2 \times Z7 + y \times z \times Z8$
F52: $y \times z \times Z7 + z^2 \times Z8$
F53: $y \times Z12 + z \times z13$
F54: $-z \times Z12 + y \times Z13$
F55: $y \times Z9$
F56: $z \times Z9$
F57: Z14
F58: Z15
F59: $(y^2 - z^2) \times y \times Z5 + 2 \times y^2 \times z \times Z6$
F60: $(y^2 - z^2) \times z \times Z5 + 2 \times y \times z^2 \times Z6$
F61: $(y^2 - z^2) \times Z10 + 2 \times y \times z \times Z11$
F62: $-2 \times y \times z \times Z10 + (y^2 - z^2) \times Z11$
F63: $(y^2 + z^2) \times y \times Z7 + (y^2 + z^2) \times z \times Z8$
F64: $(y^2 + z^2) \times Z9$
F65: $(y^4 - z^4) \times Z5 + 2 \times y \times z \times (y^2 + z^2) \times Z6$
F66: $(x^2 + y^2) \times Z4$
F67: $(y^2 + z^2)^2 \times y \times Z2 + (y^2 + z^2)^2 \times z \times Z3$
F68: $(y^2 - z^2) \times Z12 + 2 \times y \times z \times Z13$
F69: $y \times z14 + z \times Z15$
F70: Z16
F71: $(y^2 - 3 \times z^2) \times y \times Z10 - (z^2 - 3 \times y^2) \times z \times Z11$ Furthermore, in the present embodiment, in order to increase the orthogonality of the functions Fi of the respective terms in the aberration polynomial Σ(Mi·Fi), the linear coupling of the Zernike functions Zi of the respective terms is newly transformed, and the functions FZi of the respective terms in the aberration polynomial Σ(Mi·FZi) are defined so that fitting error tends not to occur when the wavefront aberration is fitted (approximated) by the aberration polynomial Σ(Mi·Fi). In concrete terms, fitting error tends to occur between the function F5 of the fifth term and the function F21 of the 21$^{st}$ term in the aberration polynomial Σ(Mi·Fi); accordingly, the function FZ21 of the 21$^{st}$ term in the aberration polynomial Σ(Mi·FZi) is defined as 2×F21−F5.

The functions FZi of the respective terms in the aberration polynomial Σ(Mi·FZi) are shown in the following Table (7). Furthermore, FZa1=Z10 and FZa2=Z11 are added as functions FZai that correspond to 3 θ components which are uniform within the image plane and which have a three-revolution rotational symmetry with respect to the rotation in the pupil, so that the aberration distribution of the projection optical system PL can be expressed more accurately. Moreover, in Table (7), the functions FZi beyond the 72$^{nd}$ term are omitted.

TABLE 7

FZ1: Z1
FZ2: Z2
FZ3: Z3
FZ4: Z4
FZ5: $y \times Z2 + z \times Z3$
FZ6: Z5
FZ7: Z6
FZ8: $y \times Z2 - z \times Z3$
FZ9: $z \times Z2 + y \times Z3$
FZ10: $z^2 \times Z2 - y \times z \times Z3$
FZ11: $-y \times z \times Z2 + y^2 \times Z3$
FZ12: $y \times Z4$
FZ13: $z \times Z4$
FZ14: Z7
FZ15: Z8
FZ16: $y^2 \times Z2 + y \times z \times Z3$
FZ17: $y \times z \times Z2 + z^2 \times Z3$
FZ18: $y \times Z5 + z \times Z6$
FZ19: $-z \times Z5 + y \times Z6$
FZ20: $(y^2 + z^2) \times Z4$
FZ21: $(2 \times (y^2 + z^2) - 1) \times y \times Z2 +$
$(2 \times (y^2 + z^2) - 1) \times z \times Z3$
FZ22: $y \times Z7 + z \times Z8$
FZ23: Z9
FZ24: $(y^2 - z^2) \times Z5 + 2 \times y \times z \times Z6$
FZ25: $(y^2 + z^2) \times Z5$
FZ26: $(y^2 + z^2) \times Z6$
FZ27: $(2 \times (y^2 + z^2) - 1) \times y \times Z2 -$
$(2 \times (y^2 + z^2) - 1) \times z \times Z3$
FZ28: $(2 \times (y^2 + z^2) - 1) \times z \times Z2 +$
$(2 \times (y^2 + z^2) - 1) \times y \times Z3$
FZ29: $(y^2 - z^2) \times Z4$
FZ30: $2 \times y \times z \times Z4$
FZ31: Z12
FZ32: Z13
FZ33: $y \times Z7 - z \times Z8$
FZ34: $z \times Z7 + y \times Z8$
FZ35: $(2 \times (y^2 - z^2) - 1) \times y \times Z2 +$
$(2 \times (y^2 - z^2) - 1) \times z \times Z3$
FZ36: $(4 \times y^2 - 1) \times z \times Z2 + (4 \times z^2 - 1) \times y \times Z3$
FZ37: $y \times Z10 + z \times Z11$
F238: $-z \times Z10 + y \times Z11$
FZ39:
FZ40:
FZ41: $(3 \times (y^2 + z^2) - 2) \times y \times Z4$
FZ42: $(3 \times (y^2 + z^2) - 2) \times z \times Z4$
FZ43: $z^2 \times Z7 - y \times z \times Z8$
FZ44: $-y \times z \times Z7 + y^2 \times Z8$
FZ45: $(2 \times (y^2 + z^2) - 1) \times y^2 \times Z2 +$
$(2 \times (y^2 + z^2) - 1) \times y \times z \times Z3$
FZ46: $(2 \times (y^2 + z^2) - 1) \times y \times z \times Z2 +$
$(2 \times (y^2 + z^2) - 1) \times z^2 \times Z3$
FZ47: $(2 \times (y^2 + z^2) - 1) \times y \times Z5 +$
$(2 \times (y^2 + z^2) - 1) \times z \times Z6$
FZ48: $-(2 \times (y^2 + z^2) - 1) \times z \times Z5 +$
$(2 \times (y^2 + z^2) - 1) \times y \times Z6$
FZ49: $(2 \times (y^2 + z^2) - 1) \times Z2 +$
$(2 \times (y^2 + z^2) - 1) \times y \times z \times Z3$
FZ50: $-(2 \times (y^2 + z^2) - 1) \times y \times z \times Z2 +$
$(2 \times (y^2 + z^2) - 1) \times y^2 \times Z3$
FZ51: $y^2 \times Z7 + y \times z \times Z6$
FZ52: $y \times z \times Z7 + z^2 \times Z8$
FZ53: $y \times Z12 + z \times Z13$
FZ54: $-z \times Z12 + y \times Z13$
FZ55: $y \times Z9$
FZ56: $z \times Z9$
FZ57: Z14
FZ58: Z15
FZ59: $(2 \times (y^2 - z^2) - 1) \times y \times Z5 +$
$(4 \times y^2 - 1) \times z \times Z6$
FZ60: $(2 \times (y^2 - z^2) - 1) \times z \times Z5 +$
$(4 \times z^2 - 1) \times z \times Z6$
FZ61: $(y^2 - Z^2) \times Z10 + 2 \times y \times z \times Z11$
FZ62: $-2 \times y \times z \times Z10 + (y^2 - z^2) \times Z11$
FZ63: $(2 \times (y^2 + z^2) - 1) \times y \times Z7 +$
$(2 \times (y^2 + z^2) - 1) \times z \times Z8$
FZ64: $(2 \times (y^2 + z^2) - 1) \times Z9$
FZ65: $(2 \times (y^4 - z^4) - (y^2 - z^2)) \times Z5 +$
$2 \times (2 \times (y^2 + z^2) - 1) \times y \times z \times Z6$ TABLE 7-continued FZ66: $(6 \times (x^2 + y^2)^2 - 6 \times (y^2 + z^2) + 1) \times Z4$
FZ67: $(6 \times (x^2 + y^2)^2 - 6 \times (y^2 + z^2) + 1) \times y \times Z2 +$
$(6 \times (x^2 + y^2)^2 - 6 \times (y^2 + z^2) + 1) \times z \times Z3$
FZ68: $(y^2 - z^2) \times Z12 + 2 \times y \times z \times Z13$
FZ69: $y \times Z14 + z \times Z15$
FZ70: Z16
FZ71: $(y^2 - 3 \times z^2) \times y \times Z10 - (z^2 - 3 \times y^2) \times z \times Z11$
FZa1: Z10
FZa2: Z11

Thus, in the present embodiment, the aberration polynomial $\Sigma(Mi \cdot FZi)$ is finally set as an aberration polynomial that generally expresses the aberration of the projection optical system PL as a function of the image plane coordinates and pupil coordinates. Furthermore, in the present embodiment, functions up to functions expressing fifth-order (light ray aberration) rotational symmetric aberration components were calculated as examples of the functions FZi of the respective terms in the aberration polynomial $\Sigma(Mi \cdot FZi)$. However, it would also be possible to calculate functions expressing even higher-order aberration components by a similar method for the functions Fzi of ordinary terms other than the additional terms (FZa1, FZa2).

Furthermore, if Z4 in Table (7) is replaced by a linear coupling S of a Zernike function (as shown below) in order to express the focus component more accurately, the fitting precision of the focus component or spherical aberration component at the respective evaluation points can be improved. This is especially effective in cases where an imaging optical system that has a high numerical aperture is evaluated.

$$S = \{1/320 \times NA^6 \times Z16 + (3/192 \times NA^6 + 1/48 \times NA^4) \times Z9 + \qquad (S)$$
$$(9/320 \times NA^6 + 1/16 \times NA^4 + 1/4 \times NA^2) \times Z4\}/$$
$$\{1/320 \times NA^6 + (3/192 \times NA^6 + 1/48 \times NA^4) +$$
$$(9/320 \times NA^6 + 1/16 \times NA^4 + 1/4 \times NA^2)\}$$

In the abovementioned equation (S), the constant term is removed from an equation in which a power series development to the sixth power is expressed by a Zernike function for a pupil radial vector in which the spherical wave is normalized by the numerical aperture NA. This is normalized so that the maximum value 1. Furthermore, in the case of a function series that includes higher-order pupil function components, the order number of development can be expanded to a higher order by a similar procedure.

Figure 3A:
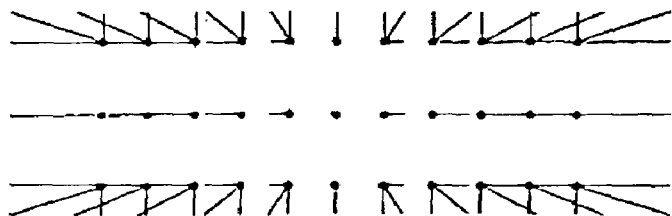
FIG. 3A is a diagram which shows the condition of aberration expressed by the function FZ5 of the fifth term in the aberration polynomial of the present embodiment.
Figure 3B:
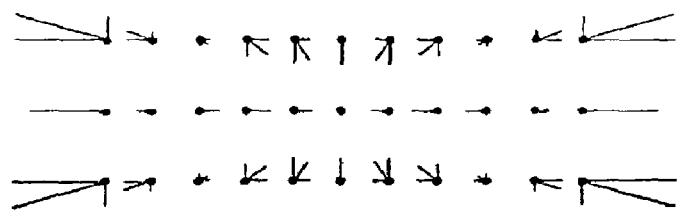
FIG. 3B is a diagram which shows the condition of aberration expressed by the function FZ21 of the twenty-first term in the aberration polynomial of the present embodiment.
Figure 4A:
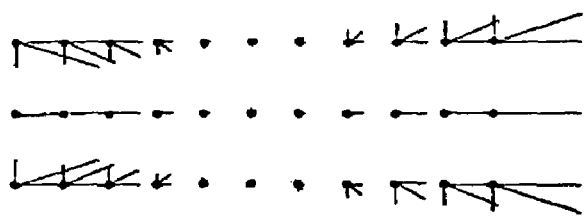
FIG. 4A is a diagram which shows the condition of aberration expressed by the function FZ16 of the sixteenth term in the aberration polynomial of the present embodiment.
Figure 4B:
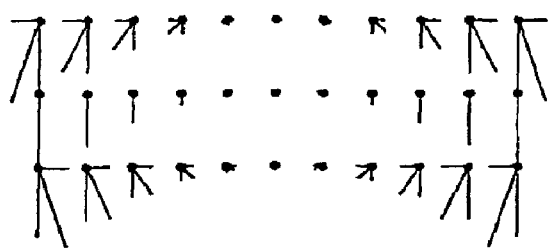
FIG. 4B is a diagram which shows the condition of aberration expressed by the function FZ11 of the eleventh term in the aberration polynomial of the present embodiment.

FIG. 3A is a diagram which shows the conditions of magnification aberration expressed by the function FZ5 of the fifth term and FIG. 3B is a diagram which shows the conditions of the distortion aberration expressed by the function FZ21 of the 21$^{st}$ term (b), in the aberration polynomial $\Sigma(Mi \cdot FZi)$ of the present embodiment. Furthermore, FIG. 4A is a diagram which shows the conditions of the distortion aberration in the meridional direction expressed by the function FZ16 of the 16$^{th}$ term and FIG. 4B is a diagram which shows the conditions of the distortion aberration in the sagittal direction expressed by the function FZ11 of the 11$^{th}$ term, in the aberration polynomial $\Sigma(Mi \cdot FZi)$ of the present embodiment.

Figure 5A:
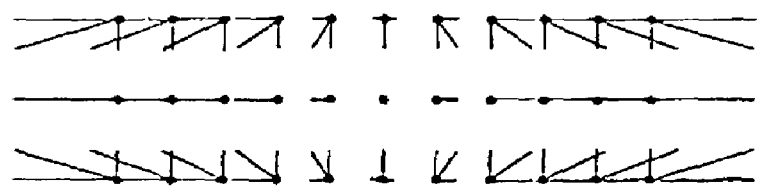
FIG. 5A is a diagram which shows the condition of aberration expressed by the function FZ8 of the eighth term in the aberration polynomial of the present embodiment.
Figure 5B:
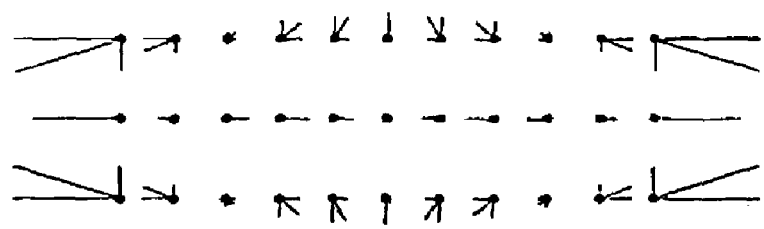
FIG. 5B is a diagram which shows the condition of aberration Expressed by the function FZ27 of the twenty-seventh term in the aberration polynomial of the present embodiment.
Figure 5C:
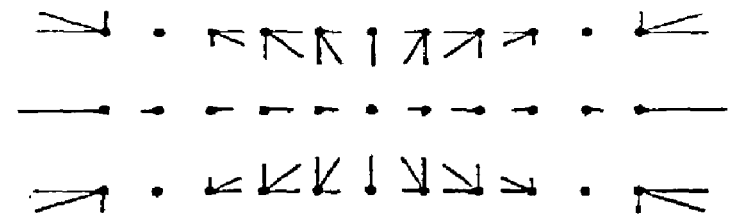
FIG. 5C is a diagram which shows the condition of aberration expressed by the function FZ35 of the thirty-fifth term in the aberration polynomial of the present embodiment.

Furthermore, FIG. 5A is a diagram which shows the conditions of the rectangular distortion aberration expressed by the function FZ8 of the eighth term, FIG. 5B is a diagram which shows the conditions of the fourth-order rectangular distortion (1) aberration expressed by the function FZ27 of the 27$^{th}$ term and FIG. 5C is a diagram which shows the conditions of the fourth-order rectangular distortion (2) aberration expressed by the function FZ35 of the 35th term, in the aberration polynomial $\Sigma(Mi \cdot FZi)$ of the present embodiment. In FIGS. 3 through 5, the ideal image points are indicated by black circles disposed in the form of a matrix, and the directions and amounts by which the actual image points are shifted are indicated by line segments from the respective ideal image points.

Figure 6:
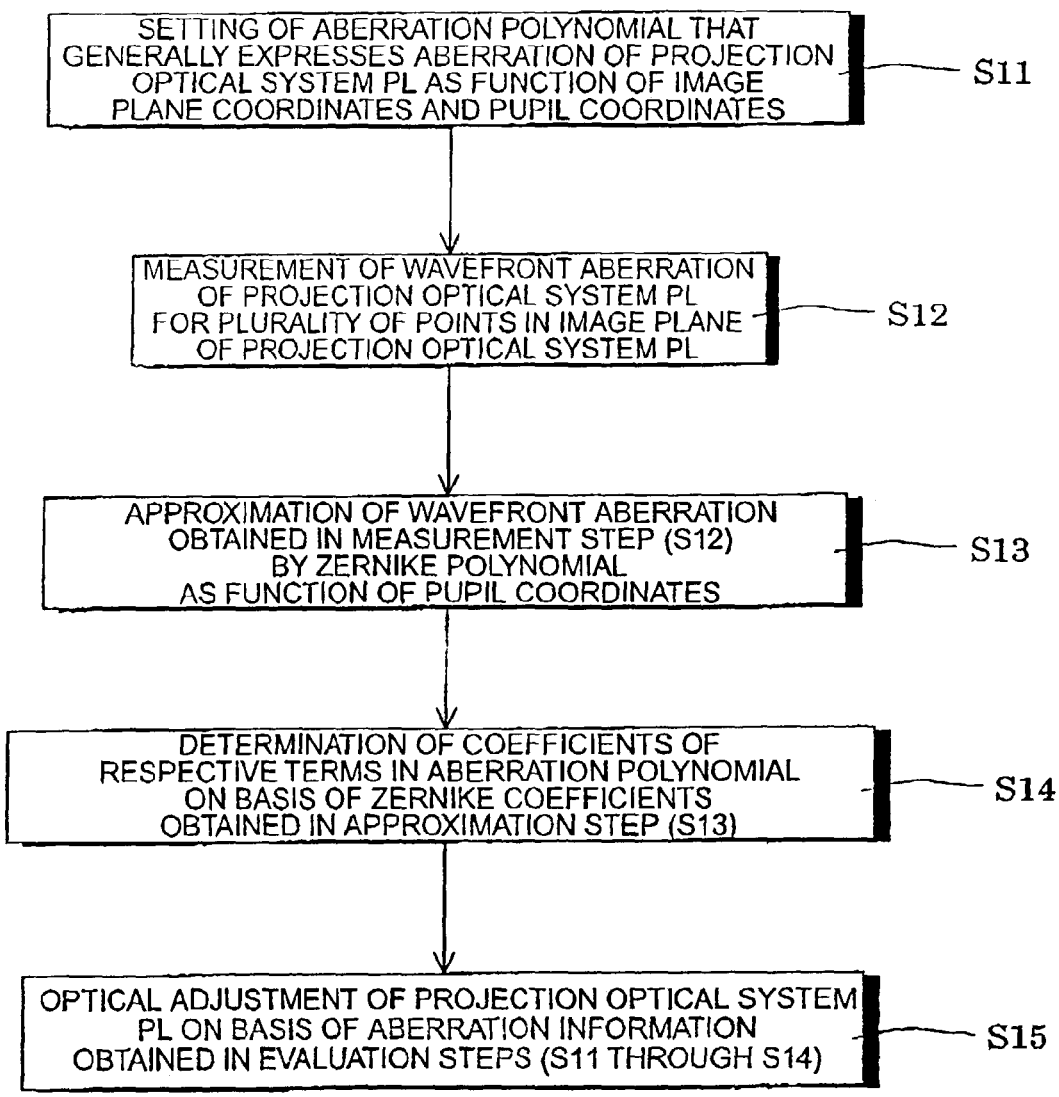
FIG. 6 is a flow chart which shows the steps of the evaluation method and adjustment method of the projection optical system PL in the present embodiment.

FIG. 6 is a flow chart which shows the steps of the evaluation method and adjustment method of the projection optical system PL in the present embodiment. In the present embodiment, referring to FIG. 6, an aberration polynomial $\Sigma(Mi \cdot FZi)$ that generally expresses the aberration of the projection optical system PL as a function of the image plane coordinates and pupil coordinates is set using the above-mentioned procedure referring to Tables (1) through (7) (S11). Nest, the wavefront aberration is measured for a plurality of points in the image plane of the projection optical system PL (S12). The Fizeau type interferometer disclosed in (for example) U.S. Pat. No. 5,898,501 (corresponding to Japanese Patent Application Laid-Open No. 10-38757 and Japanese Patent Application Laid-Open No 10-30758) can be used to measure the wavefront aberration of the projection optical system PL.

Furthermore, the PDI (point diffraction interferometer) disclosed in Japanese Patent Application Laid-Open No. 2000-97617, the phase recovery method disclosed in Japanese Patent Application Laid-Open No. 10-284368 and U.S. Pat. No. 4,309,602, the S/H (Schach-Hartmann) method disclosed in WO99/60361, WO00/55890 and Japanese Patent Application No. 2000-258085, the method of Litel Instruments Inc. disclosed in U.S. Pat. No. 5,828,455 and U.S. Pat. No. 5,978,085 or the like can also be used.

Furthermore, the method using a half-tone phase shift mask disclosed in Japanese Patent Application Laid-Open No. 2000-146757, or a method using a light bundle that passes through a portion of the interior of the pupil as disclosed in Japanese Patent Application Laid-Open No. 10-170399, Jena Review 1991/1, pp. 8–12 "Wavefront analysis of photolithographiclenses", Wolfgang Freitag et al., Applied Optics Vol. 31, No. 13, May 1, 1992, pp. 2284–2290 "Aberration analysis in aerial images formed by lithographic lenses", Wolfgang Freitag et al., and Japanese Patent Application Laid-Open No. 2002-22609 or the like can also be used.

Next, in the present embodiment, the wavefront aberration obtained in the measurement step (S12) is approximated by a Zernike polynomial as a function of the pupil coordinates (S13). In concrete terms, the wavefront aberration measured for a plurality of points in the image plane is fitted by a Zernike polynomial, and the Zernike coefficients $Ci$ of the respective terms are calculated for each image point. Next, the coefficients $Mi$ of the respective terms in the aberration polynomial $\Sigma(Mi \cdot Fzi)$ of the present embodiment are determined on the basis of the Zernike coefficients $Ci$ of the respective terms in the Zernike polynomial obtained in the approximation step (S14).

In concrete terms, for example, specified Zernike functions $Z2$ and $Z3$ are noted, and the coefficient $M5$ of the fifth term, the coefficient $M8$ of the eighth term, the coefficient $M9$ of the ninth term, the coefficient $N10$ of the tenth term and the like in the aberration polynomial $\Sigma(Mi \cdot FZi)$ are determined on the basis of the image plane distribution of the corresponding Zernike coefficients $C2$ and $C3$ (the distribution of the coefficients $C2$ and $C3$ at the respective image points). Furthermore, other specified Zernike functions $Zi$ are noted, and the coefficients $Mi$ of other terms in the aberration polynomial $\xi(Mi \cdot FZi)$ are successively determined on the basis of the image plane distribution of the corresponding Zernike coefficients $Ci$.

Thus, in the present embodiment, an aberration polynomial $\xi(Mi \cdot FZi)$ which simultaneously expresses the pupil distribution and image plane distribution of the aberration of the projection optical system PL is finally obtained on the basis of the functions $FZi$ of the respective terms stipulated in Table (7) and the coefficients $Mi$ of the respective terms determined in the approximation step (S14). Finally, the projection optical system PL is optically adjusted (S15) on the basis of the aberration information for the projection optical system PL obtained by the evaluation method of the present embodiment (S11 through S14) (i.e., on the basis of the aberration polynomial $\xi(Mi \cdot FZi)$ that is finally obtained).

In the present embodiment, the aberration components of the projection optical system PL can be analyzed by using an aberration polynomial $\xi(Mi \cdot FZi)$ that simultaneously expressed the pupil distribution and image plane distribution of the projection optical system PL. Accordingly, corrections, i.e., the optical adjustment method and amount of optical adjustment, can be calculated quickly and accurately compared to a conventional method in which numerical optimization is performed on a trial and error basis using a computer. In other words, the characterizing features of the conditions of aberration of the projection optical system PL can easily be grasped by means of the aberration polynomials $\xi(Mi \cdot FZi)$; accordingly, it may be expected that prospects for optical adjustment will be enhanced.

Conventionally, furthermore, a method using automatic correction has been widely used in various types of error analysis in the design stage. However, the conditions of aberration of the projection optical system PL can be definitively determined by using the aberration polynomial $\xi(Mi \cdot FZi)$ of the present embodiment; accordingly, simple and accurate analysis may be expected.

Furthermore, in the embodiment described above, the order numbers are limited in the derivation of the aberration polynomial $\xi(Mi \cdot FZi)$ in order to allow sufficient expression of the aberration of the projection optical system PL while avoiding bothersome calculations. If necessary, however, the order numbers can be further increased in the aberration polynomial calculation method of the present invention. Moreover, in the abovementioned embodiment, the aberration polynomial $\xi(Mi \cdot FZi)$ is used in the evaluation method and adjustment method of the projection optical system PL. However, the present invention is not limited to this; it would also be possible to use the aberration polynomial $\xi(Mi \cdot Fi)$.

In the exposure apparatus of the abovementioned embodiment, micro-devices (semiconductor elements, imaging elements, liquid crystal display elements, thin-film magnetic heads and the like) can be manufactured by illuminating the reticle (mask) by means of an illumination apparatus (illumination step), and using the projection optical system to expose the transfer pattern that is formed or, the mask on a photosensitive substrate. Below, one example in which semiconductor devices are obtained as micro-devices by using the exposure apparatus of the present embodiment to form specified circuit patterns on wafers or the like used as photosensitive substrates will be described with reference to the flow chart-shown in FIG. 7.

Figure 7:
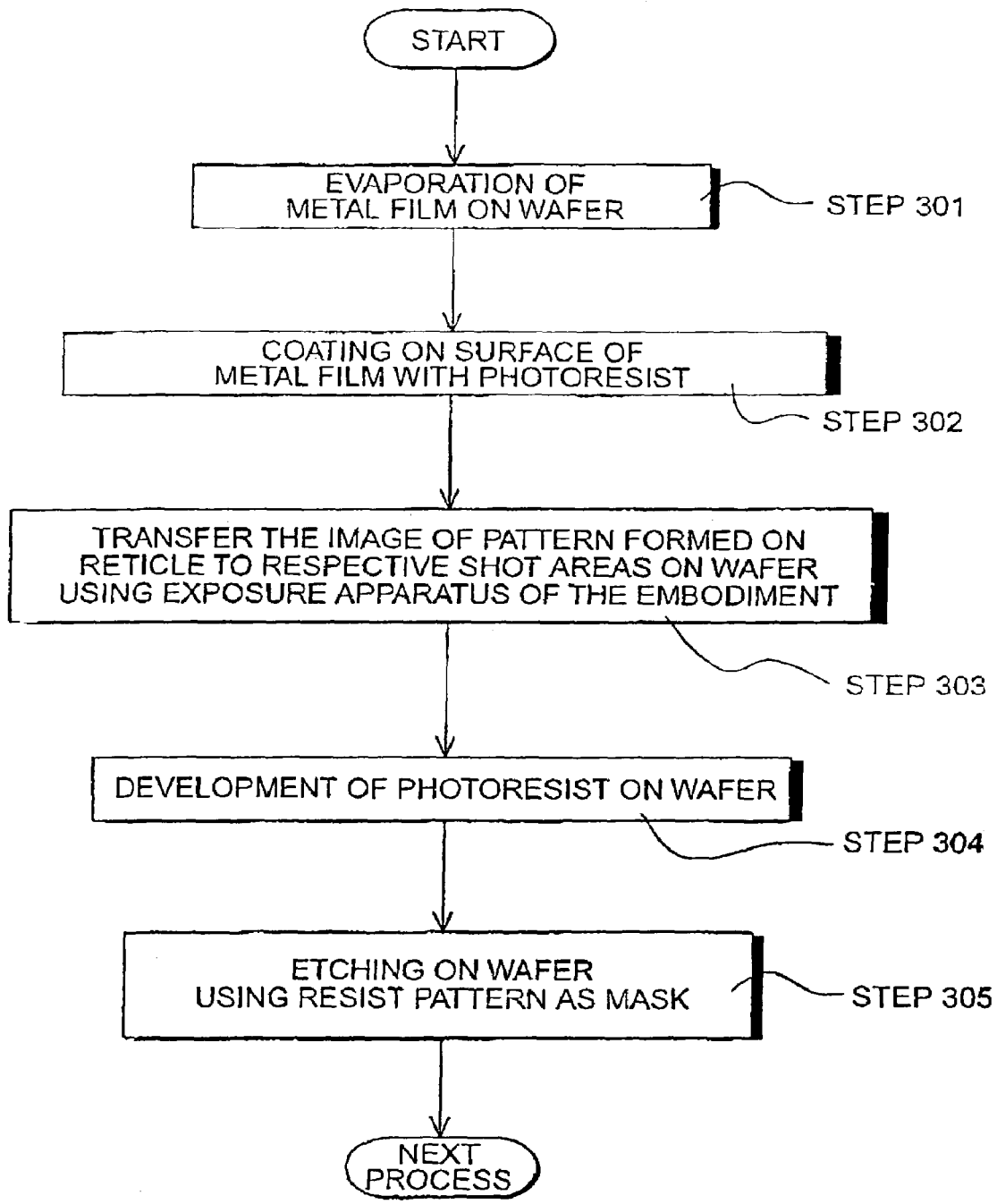
FIG. 7 is a flow chart which shows the procedure used when semiconductor devices are obtained as micro-devices.

First, in step 301 in FIG. 7, a metal film is vacuum-evaporated on one lot of wafers. In the next step 302, the metal films on the wafers of this lot are coated with a photoresist. Afterward, in step 303, the exposure apparatus of the present embodiment is used to successively transfer an image of the pattern on the mask onto the respective shot areas on the wafers of this lot. Subsequently, after the photoresist on the wafers of this lot is developed in step 304, the wafers of this lot are etched using the resist pattern as a mask in step 305, so that circuit patterns corresponding to the pattern on the mask are formed in the respective shot areas on each wafer.

Afterward, devices such as semiconductor elements or the like are manufactured by further forming circuit patterns of addition layers on top or the like. In the abovementioned semiconductor device manufacturing method, semiconductor devices that have extremely fine circuit patterns can be favorably obtained. Furthermore, the respective steps of vacuum-evaporating metal on the wafers, coating the metal films with a resist, and then exposing, developing and etching the wafers are performed in steps 301 through 305. However, it goes without saying that it would also be possible to form silicon oxide films on the wafers prior to these steps, and then to perform the respective steps of coating these silicon oxide films with a resist, and exposing, developing and etching the wafers or the like.

Figure 8:
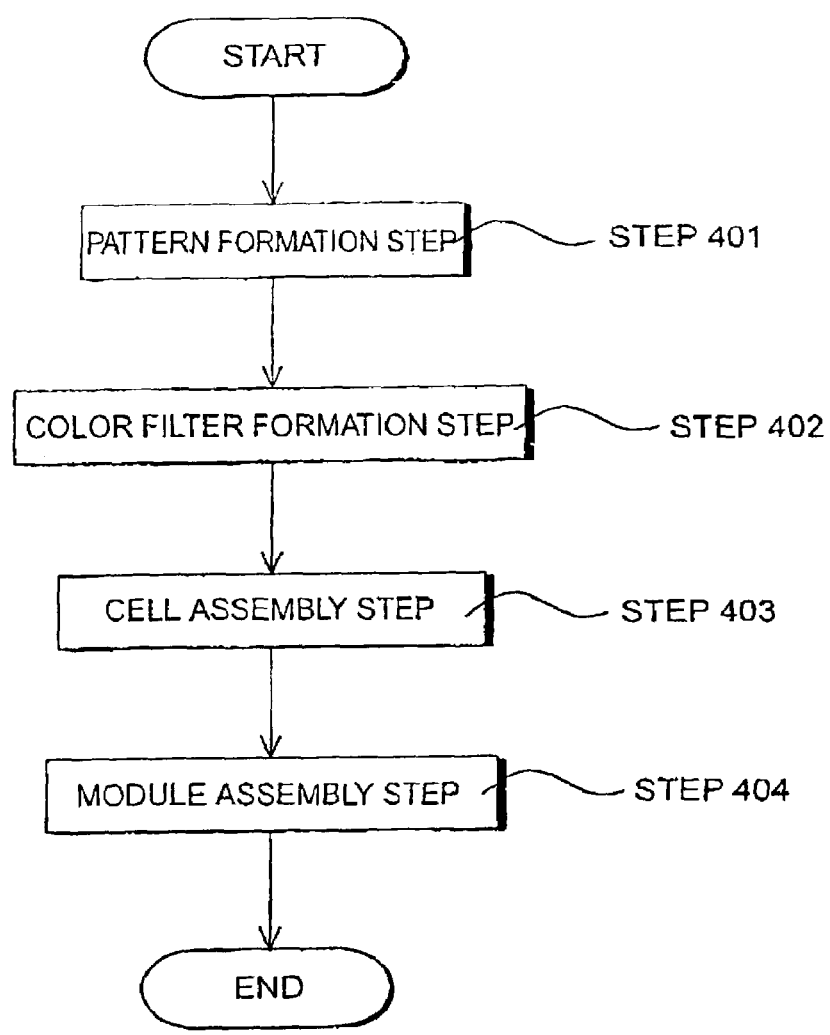
FIG. 8 is a flow chart which shows the procedure used when liquid crystal display elements are obtained as micro-devices.

Furthermore, in the exposure apparatus of the present embodiment, it is also possible to obtain liquid crystal display elements as micro-devices by forming specified patterns (circuit patterns, electrode patterns or the like) on plates (glass substrates). One example of the procedure used in such a case will be described below with reference to the flow chart shown in FIG. 8. In the pattern formation step 401 in FIG. 8, the exposure apparatus of the present embodiment is used to perform a so-called photolithographic step in which the pattern of a mask is transferred and exposed on a photosensitive substrate (glass plate or the like which is coated with a resist). A specified pattern including numerous electrodes is formed on the surface of the photosensitive substrate by this photolithographic step. Afterward, the exposed substrate passes through respective steps such as a developing step, etching step, resist stripping step and the like, so that a specified pattern is formed on the surface of he substrate. The processing then proceeds to the subsequent color filter formation step 402.

Next, in the color filter formation step 402, numerous combinations of three dots corresponding to R (red), G (green) and B (blue) are arranged in the form of a matrix, or a plurality of combinations of filters consisting of three stripes of R, G and B are arranged in the direction of the horizontal scan lines, so that color filters are formed. Then, following the color filter formation step 402, a cell assembly step 403 is performed. In the cell assembly step 403, liquid crystal panels (liquid crystal cells) are assembled using the substrates with specified patterns obtained in the pattern formation step 401 ad the color filters obtained in the color filter formation step 402. In the cell assembly step 403, for example, liquid crystal panels (liquid crystal cells) are manufactured by introducing a liquid crystal into the spaces between the substrates with specified patterns obtained in the pattern formation step 401 and the color filters obtained in the color filter formation step 402.

Afterward, in the module assembly step 404, liquid crystal display elements are completed by attaching various parts such as electrical circuits the control the display operation of the assembled liquid crystal panels (liquid crystal cells), back lighting and the like. The abovementioned liquid crystal display element manufacturing method makes to obtain liquid crystal display elements that have extremely fine circuit patterns with a good throughput.

Furthermore, in the embodiment described above, the present invention is applied to a projection optical system mounted in an exposure apparatus. However, the present invention is not limited to this; the present invention can also be applied to other general imaging optical systems. Furthermore, in the abovementioned embodiment, the present invention is applied to a projection optical system mounted in a so-called scanning exposure type exposure apparatus. However, the present invention is not limited to this; the present invention can also be applied to projection optical systems mounted in exposure apparatuses of the type in which the exposure is performed all at one time.

Furthermore, in the abovementioned embodiment, and $F_2$ laser light source which supplies light with a wavelength of 157 nm is used. However, the present invention is not limited to this; for example, it would also be possible to use a deep ultraviolet light source such as a KrF excimer laser light source which supplies light with a wavelength of 248 nm, an ArF excimer laser light source which supplies light with a wavelength of 193 nm or the like, a vacuum ultraviolet light source such as a $Kr_2$ laser light source which supplies light with a wavelength of 146 nm, an $Ar_2$ laser light source which supplies light with a wavelength of 126 nm or the like, or a mercury lamp or the like which supplies the g line (436 nm) or i line (365 nm).

In the evaluation method of the present invention, as was described above, the aberration of an imaging optical system can be analytically evaluated by simultaneously expressing the pupil distribution and image plane distribution of the aberration of the imaging optical system. Accordingly, such an imaging optical system can be optically adjusted in a favorable manner on the basis of the analytical evaluation of the aberration obtained by the evaluation method of the present invention. Furthermore, favorable projection and exposure can be accomplished using an imaging optical system that has be optically adjusted in a favorable manner by the adjustment method of the present invention, so that good micro-devices can be manufactured.

The invention claimed is:

1. An evaluation method for evaluating aberration of an imaging optical system, comprising:
   a first step of setting an aberration polynomial that generally expresses the aberration of said imaging optical system as a function of image plane coordinates and pupil coordinates;
   a second step of measuring wavefront aberration of said imaging optical system for a plurality of points in an image plane of said imaging optical system;
   a third step of approximating a specified polynomial as a function of the pupil coordinates to said wavefront aberration obtained in the second step; and
   a fourth step of determining coefficients of respective terms of said aberration polynomial on the basis of coefficients of respective terms of said specified polynomial obtained in the third step;
   wherein said aberration polynomial is set so as to include at least one aberration component selected from among a rotational symmetric aberration component with respect to an optical axis of said imaging optical system, a decentering aberration component and an astigmatic aberration component, and
   wherein the fourth step includes a second approximation step of approximating a second specified polynomial as a function of said image plane coordinates to an image plane distribution of the coefficients of the respective terms in said specified polynomial that is obtained in the third step.

2. The evaluation method according to claim 1, wherein said specified polynomial includes a Zernike polynomial.

3. The evaluation method according to claim 1, wherein said aberration polynomial is set so as to include at least one aberration component selected from among said decentering aberration component and said astigmatic aberration component.

4. The evaluation method according to claim 3, wherein said rotational symmetric aberration component is expressed as a power series of invariable quantities with respect to rotation in said image plane coordinates and said pupil coordinates.

5. The evaluation method according to claim 4, wherein said decentering aberration component is expressed as a product of a linear dependent component of the coordinates in said image plane coordinates and said pupil coordinates, and a power series of invariable quantities with respect to said rotation.

6. The evaluation method according to claim 4, wherein said astigmatic aberration component includes a product of a quadratic dependent component of the coordinates in said image plane coordinates and said pupil coordinates, which is a 180-degree periodic function with respect to the rotation of the coordinates, and a power series of invariable quantities with respect to said rotation.

7. The evaluation method according to claim 1, wherein said rotational symmetric aberration component is expressed as a power series of invariable quantities with respect to rotation in said image plane coordinates and said pupil coordinates.

8. The evaluation method according to claim 7, wherein said decentering aberration component is expressed as a product of a linear dependent component of the coordinates in said image plane coordinates and said pupil coordinates, and a power series of invariable quantities with respect to said rotation.

9. The evaluation method according to claim 7, wherein said astigmatic aberration component includes a product of a quadratic dependent component of the coordinates in said image plane coordinates and said pupil coordinates, which is a 180-degree periodic function with respect to the rotation of the coordinates, and a power series of invariable quantities with respect to said rotation.

10. The evaluation method of claim 1, further comprising:
an adjustment method for adjusting an imaging optical system, the adjustment method comprising the steps of:
obtaining aberration information for said imaging optical system using the first, second, third and fourth steps; and
optically adjusting said imaging optical system on the basis of the obtained aberration information.

11. The evaluation method of claim 10, wherein optically adjusting said imaging optical system comprises optically adjusting a projection optical system of a projection exposure apparatus which projects and exposes a predetermined pattern onto a photosensitive substrate.

12. The evaluation method of claim 10, further comprising:
a projection exposure method comprising the steps of:
preparing a projection optical system which comprises the optically adjusted imaging optical system; and
projecting and exposing a predetermined pattern onto a photosensitive substrate using the projection optical system.

13. The evaluation method of claim 10, further comprising:
a device manufacturing method comprising the steps of:
preparing a projection optical system which comprises the optically adjusted imaging optical system;
projecting and exposing a predetermined pattern onto a photosensitive substrate using said projection optical system; and
developing the photosensitive substrate.

14. An evaluation method for evaluating aberration of an imaging optical system on the basis of wavefront aberration measured for a plurality of points in an image plane of said imaging optical system, comprising:
a first step of setting an aberration polynomial that generally expresses the aberration of said imaging optical system as a function of image plane coordinates and pupil coordinates;
a second step of approximating a specified polynomial as a function of the pupil coordinates to said measured wavefront aberration; and
a third step of determining coefficients of respective terms of said aberration polynomial on the basis of coefficients of respective terms in said specified polynomial obtained in the second step;
wherein said aberration polynomial is set so as to include at least one aberration component selected from among a decentering aberration component and an astigmatic aberration component, and the third step includes a second approximation step of approximating a second specified polynomial as a function of said image plane coordinates to an image plane distribution of the coefficients of the respective terms in said specified polynomial obtained in the second step.

15. A recording medium on which a program is recorded, the program executing an evaluation method for evaluating aberration of an imaging optical system on the basis of wavefront aberration measured for a plurality of points in an image plane of said imaging optical system, the program comprising instructions to perform:
a first step of setting an aberration polynomial that generally expresses the aberration of said imaging optical system as a function of image plane coordinates and pupil coordinates;
a second step of approximating a specified polynomial as a function of the pupil coordinates to said measured wavefront aberration; and
a third step of determining coefficients of respective terms of said aberration polynomial on the basis of coefficients of respective terms in said specified polynomial obtained in the second step;
wherein said aberration polynomial is set so as to include at least one aberration component selected from among a decentering aberration component and an astigmatic aberration component, and the third step includes a second approximation step of approximating a second specified polynomial as a function of said image plane coordinates to an image plane distribution of the coefficients of the respective terms in said specified polynomial obtained in the second step.

16. A computer-receivable carrier wave which carries a signal including a program, the program executing an evaluation method for evaluating aberration of an imaging optical system on the basis of wavefront aberration measured for a plurality of points in an image plane of said imaging optical system, the program comprising instructions to perform:

a first step of setting an aberration polynomial that generally expresses the aberration of said imaging optical system as a function of image plane coordinates and pupil coordinates;

a second step of approximating a specified polynomial as a function of the pupil coordinates to said measured wavefront aberration; and a third step of determining coefficients of respective terms of said aberration polynomial on the basis of coefficients of respective terms in said specified polynomial obtained in the second step;

wherein said aberration polynomial is set so as to include at least one aberration component selected from among a decentering aberration component and an astigmatic aberration component, and the third step includes a second approximation step of approximating a second specified polynomial as a function of said image plane coordinates to an image plane distribution of the coefficients of the respective terms in said specified polynomial obtained in the second step.

17. A recording medium on which a program recorded, the program executing an evaluation method for evaluating aberration of an imaging optical system, the program comprising instructions to perform:

a first step of setting an aberration polynomial that generally expresses the aberration of said imaging optical system as a function of image plane coordinates and pupil coordinates;

a second step of measuring wavefront aberration of said imaging optical system for a plurality of points in an image plane of said imaging optical system;

a third step of approximating a specified polynomial as a function of the pupil coordinates to said wavefront aberration obtained in the second step; and a fourth step of determining coefficients of respective terms of said aberration polynomial on the basis of coefficients of respective terms of said specified polynomial obtained in the third step;

wherein said aberration polynomial is set so as to include at least one aberration component selected from among a rotational symmetric aberration component with respect to an optical axis of said imaging optical system, a decentering aberration component and an astigmatic aberration component, and wherein the fourth step includes a second approximation step of approximating a second specified polynomial as a function of said image plane coordinates to an image plane distribution of the coefficients of the respective terms in said specified polynomial that is obtained in the third step.

18. A computer-receivable carrier wave which carries a signal including a program, the program executing an evaluation method for evaluating aberration of an imaging optical system, the program comprising instructions to perform:

a first step of setting an aberration polynomial that generally expresses the aberration of said imaging optical system as a function of image plane coordinates and pupil coordinates;

a second step of measuring wavefront aberration of said imaging optical system for a plurality of points in an image plane of said imaging optical system;

a third step of approximating a specified polynomial as a function of the pupil coordinates to said wavefront aberration obtained in the second step; and a fourth step of determining coefficients of respective terms of said aberration polynomial on the basis of coefficients of respective terms of said specified polynomial obtained in the third step;

wherein said aberration polynomial is set so as to include at least one aberration component selected from among a rotational symmetric aberration component with respect to an optical axis of said imaging optical system, a decentering aberration component and an astigmatic aberration component, and wherein the fourth step includes a second approximation step of approximating a second specified polynomial as a function of said image plane coordinates to an image plane distribution of the coefficients of the respective terms in said specified polynomial that is obtained in the third step.

19. The evaluation method of claim 14, further comprising:

an adjustment method for adjusting an imaging optical system, comprising the steps of:

obtaining aberration information for said imaging optical system using the first, second and third steps; and optically adjusting said imaging optical system on the basis of the obtained aberration information.

20. The evaluation method of claim 19, wherein optically adjusting said imaging optical system comprises optically adjusting a projection optical system of a projection exposure apparatus which projects and exposes a predetermined pattern onto a photosensitive substrate.

21. The evaluation method of claim 19, further comprising:

a projection exposure method comprising the steps of:
preparing a projection optical system which comprises the optically adjusted imaging optical system; and
projecting and exposing a predetermined pattern onto a photosensitive substrate using the projection optical system.

22. The evaluation method of claim 19, further comprising:

a device manufacturing method comprising the steps of:
preparing a projection optical system which comprises the optically adjusted imaging optical system;
projecting and exposing a predetermined pattern onto a photosensitive substrate using said projection optical system; and
developing the photosensitive substrate.

23. An evaluation method for evaluating aberration of an imaging optical system, comprising:

a first step of setting an aberration polynomial that generally expresses the aberration of said imaging optical system as a function of image plane coordinates and pupil coordinates;

a second step of measuring wavefront aberration of said imaging optical system for a plurality of points in an image plane of said imaging optical system;

a third step of approximating a specified polynomial as a function of the pupil coordinates to said wavefront aberration obtained in the second step; and a fourth step of determining coefficients of respective terms of said aberration polynomial on the basis of coefficients of respective terms of said specified polynomial obtained in the third step, the fourth step including a second approximation step of approximating a second specified polynomial as a function of said image plane coordinates to an image plane distribution of the coefficients of the respective terms in said specified polynomial that is obtained in the third step.

24. The evaluation method according to claim 23, wherein said specified polynomial includes a Zernike polynomial.

25. The evaluation method according to claim 23, wherein said aberration polynomial is set so as to include at least one aberration component selected from among a decentering aberration component and an astigmatic aberration component.

26. The evaluation method according to claim 25, wherein a rotational symmetric aberration component with respect to an optical axis of the imaging optical system is expressed as a power series of invariable quantities with respect to rotation in said image plane coordinates and said pupil coordinates.

27. The evaluation method according to claim 26, wherein said decentering aberration component is expressed as a product of a linear dependent component of the coordinates in said image plane coordinates and said pupil coordinates, and a power series of invariable quantities with respect to said rotation.

28. The evaluation method according to claim 26, wherein said astigmatic aberration component includes a product of a quadratic dependent component of the coordinates in said image plane coordinates and said pupil coordinates, which is a 180-degree periodic function with respect to the rotation of the coordinates, and a power series of invariable quantities with respect to said rotation.

29. The evaluation method according to claim 23, wherein a rotational symmetric aberration component with respect to an optical axis of the imaging optical system is expressed as a power series of invariable quantities with respect to rotation in said image plane coordinates and said pupil coordinates.

30. The evaluation method according to claim 29, wherein a decentering aberration component is expressed as a product of a linear dependent component of the coordinates in said image plane coordinates and said pupil coordinates, and a power series of invariable quantities with respect to said rotation.

31. The evaluation method according to claim 29, wherein an astigmatic aberration component includes a product of a quadratic dependent component of the coordinates in said image plane coordinates and said pupil coordinates, which is a 180-degree periodic function with respect to the rotation of the coordinates, and a power series of invariable quantities with respect to said rotation.

32. A recording medium on which a program is recorded, the program executing an evaluation method for evaluating aberration of an imaging optical system, the program comprising instructions to perform:
a first step of setting an aberration polynomial that generally expresses the aberration of said imaging optical system as a function of image plane coordinates and pupil coordinates;
a second step of measuring wavefront aberration of said imaging optical system for a plurality of points in an image plane of said imaging optical system;
a third step of approximating a specified polynomial as a function of the pupil coordinates to said wavefront aberration obtained in the second step; and
a fourth step of determining coefficients of respective terms of said aberration polynomial on the basis of coefficients of respective terms of said specified polynomial obtained in the third step, the fourth step including a second approximation step of approximating a second specified polynomial as a function of said image plane coordinates to an image plane distribution of the coefficients of the respective terms in said specified polynomial that is obtained in the third step.

33. A computer-receivable carrier wave which carries a signal including a program, the program executing an evaluation method for evaluating aberration of an imaging optical system, the program comprising instructions to perform:
a first step of setting an aberration polynomial that generally expresses the aberration of said imaging optical system as a function of image plane coordinates and pupil coordinates;
a second step of measuring wavefront aberration of said imaging optical system for a plurality of points in an image plane of said imaging optical system;
a third step of approximating a specified polynomial as a function of the pupil coordinates to said wavefront aberration obtained in the second step; and
a fourth step of determining coefficients of respective terms of said aberration polynomial on the basis of coefficients of respective terms of said specified polynomial obtained in the third step, the fourth step including a second approximation step of approximating a second specified polynomial as a function of said image plane coordinates to an image plane distribution of the coefficients of the respective terms in said specified polynomial that is obtained in the third step.

34. The evaluation method of claim 23, further comprising:
an adjustment method for adjusting an imaging optical system, comprising the steps of:
obtaining aberration information for said imaging optical system using the first, second, third and fourth steps; and
optically adjusting said imaging optical system on the basis of the obtained aberration information.

35. The evaluation method of claim 34, wherein optically adjusting said imaging optical system comprises optically adjusting a projection optical system of a projection exposure apparatus which projects and exposes a predetermined pattern onto a photosensitive substrate.

36. The evaluation method of claim 34, further comprising:
a projection exposure method comprising the steps of:
preparing a projection optical system which comprises the optically adjusted imaging optical system; and
projecting and exposing a predetermined pattern onto a photosensitive substrate using the projection optical system.

37. The evaluation method of claim 34, further comprising:
a device manufacturing method comprising the steps of:
preparing a projection optical system which comprises the optically adjusted imaging optical system;
projecting and exposing a predetermined pattern onto a photosensitive substrate using said projection optical system; and
developing the photosensitive substrate.

* * * * *